United States Patent [19]
Cook, II

[11] Patent Number: 5,600,550
[45] Date of Patent: Feb. 4, 1997

[54] POWER CONVERTER FOR RECREATIONAL VEHICLES AND THE LIKE

[75] Inventor: James C. Cook, II, Marshall, Mich.

[73] Assignee: Progressive Dynamics, Inc., Marshall, Mich.

[21] Appl. No.: 255,470

[22] Filed: Jun. 8, 1994

[51] Int. Cl.$^6$ ........................................ H02H 7/10
[52] U.S. Cl. ................................. 363/50; 363/15
[58] Field of Search ................................. 363/15, 21, 25, 363/26, 50, 81, 89, 97, 131, 96, 79; 320/25, 26

[56] References Cited

U.S. PATENT DOCUMENTS

| | | | |
|---|---|---|---|
| 4,151,387 | 4/1979 | Peters, Jr. | 363/96 |
| 4,564,896 | 1/1986 | Akerson | 363/56 |
| 4,742,441 | 5/1988 | Akerson | 363/97 |
| 4,871,957 | 10/1989 | Taranto et al. | 320/26 |
| 5,034,871 | 7/1991 | Okamoto et al. | 363/15 |
| 5,155,672 | 10/1992 | Brown | 363/43 |

OTHER PUBLICATIONS

Unitrode Application Note No. U-93, "A New Integrated Circuit for Current Mode Control," (8 pages).
Unitrode Application Note No. U-97, "Modelling, Analysis and Compensation of the Current-Mode Converter," (6 pages).
Unitrode Application Note No. U-100A, "The UC3842/3/4/5 Series of Current-Mode PWM IC's," (14 pages).
Unitrode Application Note No. U-111, "Practical Considerations in Current Mode Power Supplies," (18 pages).

Primary Examiner—Matthew V. Nguyen
Assistant Examiner—Adolf Berhane
Attorney, Agent, or Firm—Price, Heneveld, Cooper, DeWitt & Litton

[57] ABSTRACT

A switched power converter for a recreational vehicle includes a housing and a switched power supply. The switched power supply has a switch and at least one energy storage component, the switch controlling the supply of power to the energy storage component. The output of the energy storage component is a regulated DC output voltage. A controller generates a switching control signal for controlling the state of said switch. A protection circuit is connected to the controller for protecting the switched power supply from damage resulting when a reverse battery connection is made. The circuit also includes a controller for controlling the pulse-width of the control signals input to the switch. A fan may be provided on the housing which is selectively enabled to move cooling air over the switched power supply only when a detected temperature exceeds a threshold level. The controller may be disabled when an ambient temperature exceeds a threshold level. An optical coupler is utilized in a voltage feedback circuit. The voltage feedback circuit is compared to a current level to control the pulse-width of the pulse signal supplied to the switch. The voltage feedback is limited to an absolute current limit. The absolute current limit may have one of two levels, depending upon the level of the output voltage.

40 Claims, 14 Drawing Sheets

POWER CONVERTER FOR RECREATIONAL VEHICLES AND THE LIKE

BACKGROUND OF THE INVENTION

The present invention pertains to a power converter and, more particularly, to a power converter of the type utilized to provide DC power to the electrical system of a recreational vehicle.

Power converters for converting AC power to a regulated DC level are well known. Low cost power converters typically comprise a DC voltage regulator which controls the output voltage to be near a predetermined level. However, the output voltages of these power converters include large ripples. This instability limits the type of motors which can be used in the recreational vehicle. Accordingly, relatively costly DC motors, which operate properly with a power supply which is not stable, are used in recreational vehicles so that low cost DC voltage regulators may be employed as the DC power converter for the recreational vehicle electrical system.

An alternative to the DC voltage regulators used in recreational vehicles are switched power converters. Switched power converters have a more stable supply voltage at their outputs. However, the switched power converter circuitry required to produce the more stable output voltage is costly.

Known switched power converters generating a sufficiently high power output that they could be used for recreational vehicle applications have stringent heat dissipation requirements which are severely restrictive to recreational vehicle manufacturers. If known switched power converters are positioned too close to a heat source, vehicle thermal insulation, or any other item which limits the power converter's ability to dissipate heat, the heat generated during normal operation of the switched power converter may destroy it or ignite nearby items causing a fire in the recreational vehicle. Even if the operating temperature of the power converter is not high enough to cause severe damage to the power converter, an inability to adequately dissipate heat in a recreational vehicle application can severely limit the operating life of the switched power converter.

An additional difficulty with known switched power converters is that they are physically large. Switched power converters are large because of the substantial surface area required to accommodate all the converter components, and because the housing is used to dissipate the heat which is generated by the energy storage components and switches employed therein. Although recreational vehicles vary widely in size, they are typically densely packed to provide a large amount of household type furnishings in a small space. Accordingly, the amount of space available for the power converter is limited, which makes it particularly difficult to find a suitable mounting location for the switched power supply.

Another difficulty encountered in providing switched power converters in recreational vehicles is that switched power converters do not include adequate protection against a reverse battery connection. Recreational vehicles typically include an independent power supply, such as batteries, which are used to supply power to the vehicle when a main power supply is not available. These batteries are often disconnected when the recreational vehicle is stored. When the vehicle is removed from storage, the vehicle owner reconnects the batteries to the vehicle electrical system. If the positive and ground output terminals of the power converter are connected to the battery negative and positive terminals, a reverse battery condition occurs. In prior art switched power circuits, such a reverse battery condition destroys the power converter switching elements, which cannot handle the resulting large current flow.

The large dimensions and the limited heat dissipating ability of known switched power converters noted above greatly restrict recreational vehicle manufacturers. An additional restriction presented by known switched power converters is that they include a fan for cooling the circuit. These fans generate undesirable noise at night when people are trying to sleep in the recreational vehicle. Accordingly, recreational vehicle designers must place the power supply at a location where the cooling fan will not disturb occupants of the vehicle while they are falling asleep.

SUMMARY OF THE INVENTION

The present invention overcomes the disadvantages of prior art recreational vehicle power supplies by providing a switched power converter which generates a stable output voltage and allows recreational vehicle designers a great deal of flexibility in positioning the power converter within the recreational vehicle.

A switched power converter for a recreational vehicle according to one aspect of the invention includes a housing and a switched power supply. The switched power supply includes a switch and energy storage components positioned in the housing. A sensor is positioned in the housing for generating a temperature dependent signal. A fan on the housing moves cooling air over the switched power supply when energized. A control circuit is coupled to the sensor and the fan. The control circuit selectively supplies power to the fan. The fan is enabled when the temperature detector senses that the measured temperature is above a threshold level and the fan is disabled when the temperature detector senses that the temperature is below a threshold level.

According to another aspect of the invention, a switched power converter for a recreational vehicle includes an output for connection to a recreational vehicle battery. A switched power supply circuit, including a switch and at least one energy storage component, generates a stable regulated DC output voltage. A controller controls the switch to selectively supply energy to the storage components. Protection circuitry is connected to the controller for protecting the switched power supply from damage resulting when a reverse battery connection is made.

According to further aspects of the invention, the energy storage components include a capacitor which is coupled to the power supply output. A protection circuit for the power supply includes a capacitor switch connected across the capacitor. The capacitor switch according to a more detailed aspect of the invention is provided by a diode.

According to still further aspects of the invention, a temperature detector is coupled to the controller for inputting a temperature dependent signal. The controller is responsive to the temperature dependent signal for disabling the switched power supply when the temperature detector outputs a signal exceeding a predetermined threshold. A heat dissipating member is coupled to the switched power supply circuit. This temperature detector, together with a temperature detector for selectively enabling and disabling the cooling fan, are positioned adjacent the heat dissipating member.

According to another aspect of the invention, the switched power converter includes a current sensor for detecting a current level which is proportional to the output current of the power converter. According to a further aspect of the invention, a voltage feedback signal dependent upon the output signal level is compared against a detected current level. A switch is turned off when the sensed current exceeds the amplified difference voltage.

According to still another aspect of the invention, the circuit provides thermal protection by shutting down the switching output of the integrated circuit and also turning off the fan. According to still another aspect of the invention, the error voltage feedback includes an optical coupler for isolating the controller from the output. The feedback circuit may include an optical coupler compensation circuit which compensates for variations in the operating characteristics of the optical coupler due to aging.

The power converter according to the invention provides a more effective, stable regulated output voltage in a recreational vehicle environment. The converter provides protection against large magnitude signals generated within the switched power converter when a reverse battery condition exists. The converter also provides protection during a short circuit output condition. A temperature sensor disables the power converter if the power converter housing temperature rises above a predetermined level, whereby the power converter is protected against overheating and operating at high levels which would shorten the operating life of the power supply. These features of the invention allow the power converter to provide effective operation when mounted in a relatively small housing.

These and other aspects, features and advantages of the present invention will be better tinderstood after reading the following detailed description of the preferred embodiments, together with reference to the accompanying drawings in which:

DETAILED DESCRIPTION OF THE PREFERRED EMBODIMENTS

Figure 1:
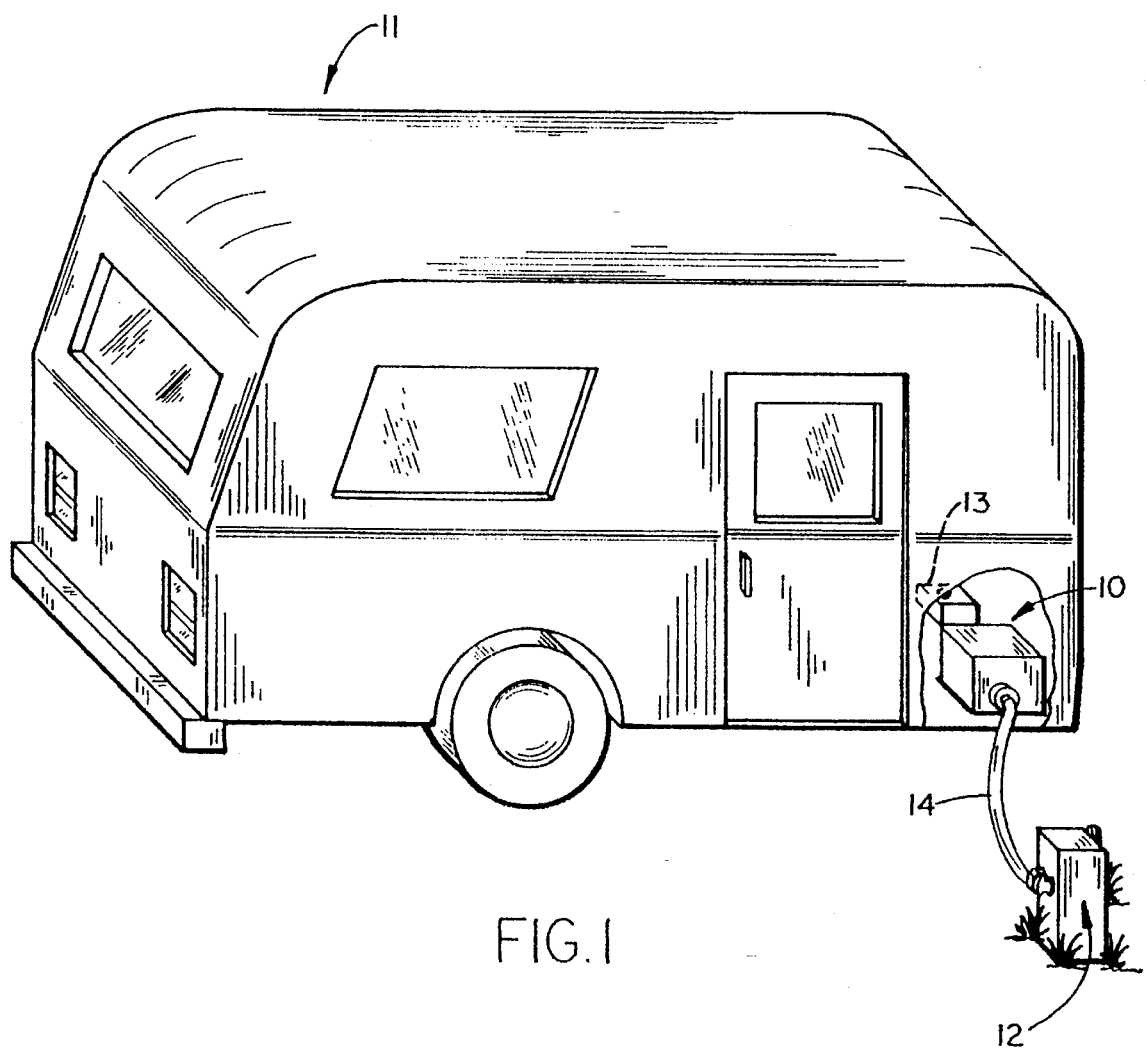
FIG. 1 is a perspective view of a recreational vehicle partially broken away to show the power converter according to the invention positioned therein.
Figure 3:
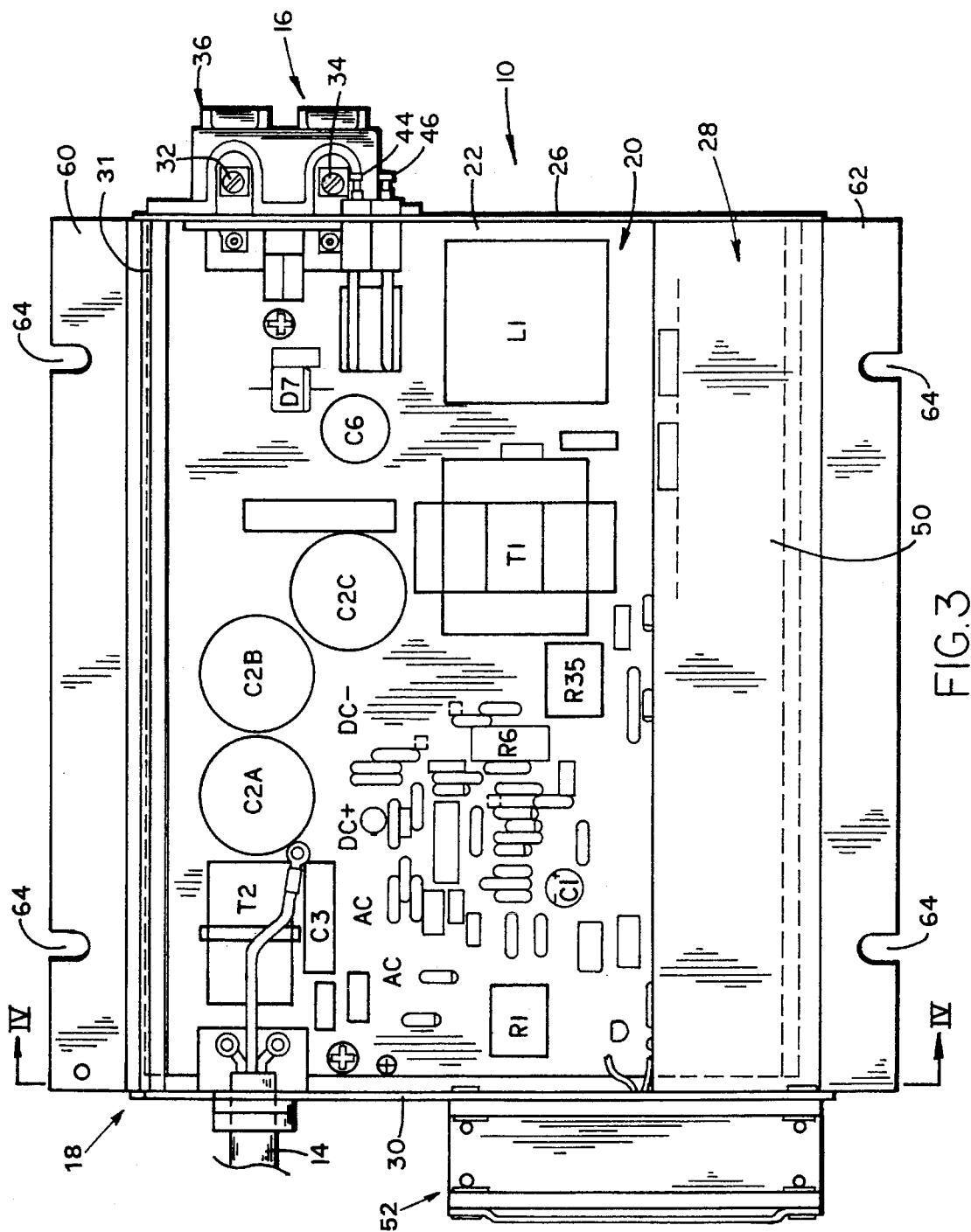
FIG. 3 is a top plan view of the power converter according to FIG. 2 with the top removed to show the switched power converter according to the invention.

A switched power converter 10 (FIG. 1) according to the invention is illustrated in a recreational vehicle 11. The power converter 10 is connected to a conventional 110 VAC power source 12 through a cable 14. The power converter 10 includes a switched power converter circuit 20 (FIG. 3) which generates a regulated DC voltage at DC output block 16 from the power input through cable 14 from the AC power source 12 (FIG. 1). The output voltage is supplied to a battery 13 (FIG. 1) and to the remainder of the recreational vehicle electrical system (not shown). The DC output voltage at output block 16 is suitable for low cost DC motors (not shown), as well as the more costly DC motors typically used for furnace blowers and other devices in recreational vehicles. Low cost DC motors are preferred in recreational vehicle 11, despite their strict power supply requirements, because of the cost savings achieved by their use.

Figure 2:
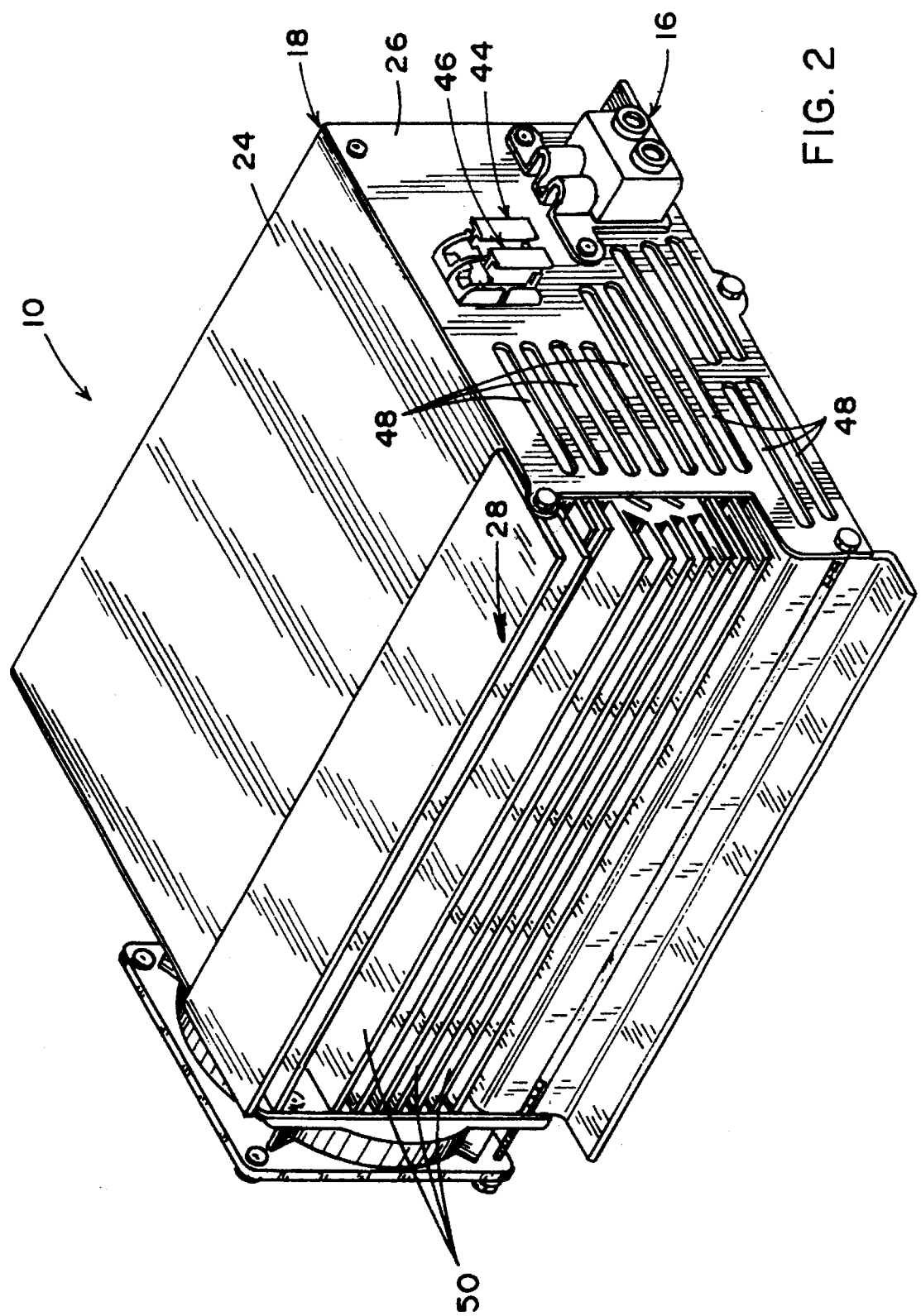
FIG. 2 is a top perspective view of a power converter according to the invention.
Figure 4A:
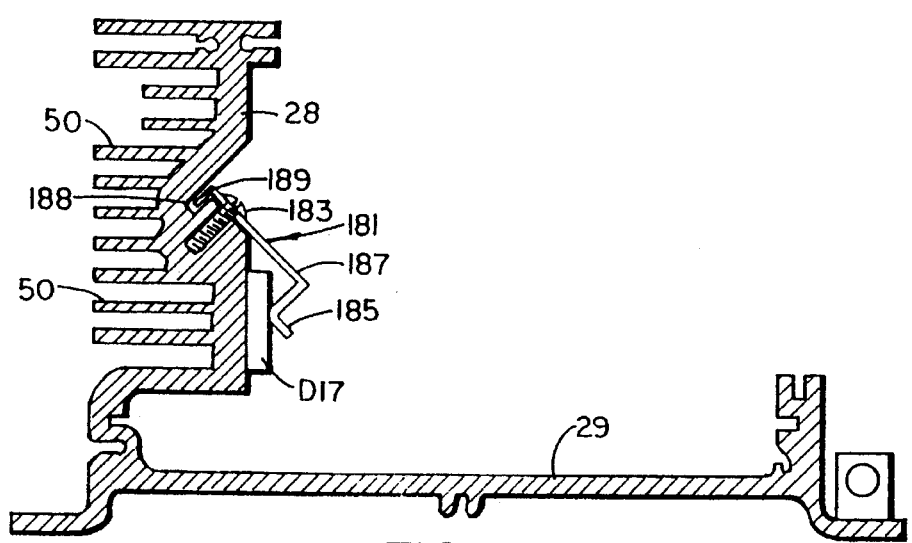
FIG. 4a is a cross-sectional view of the front wall and bottom of the housing for the power converter taken along plane IV—IV in FIG. 3 and showing a diode and clip secured to the front wall.
Figure 4:
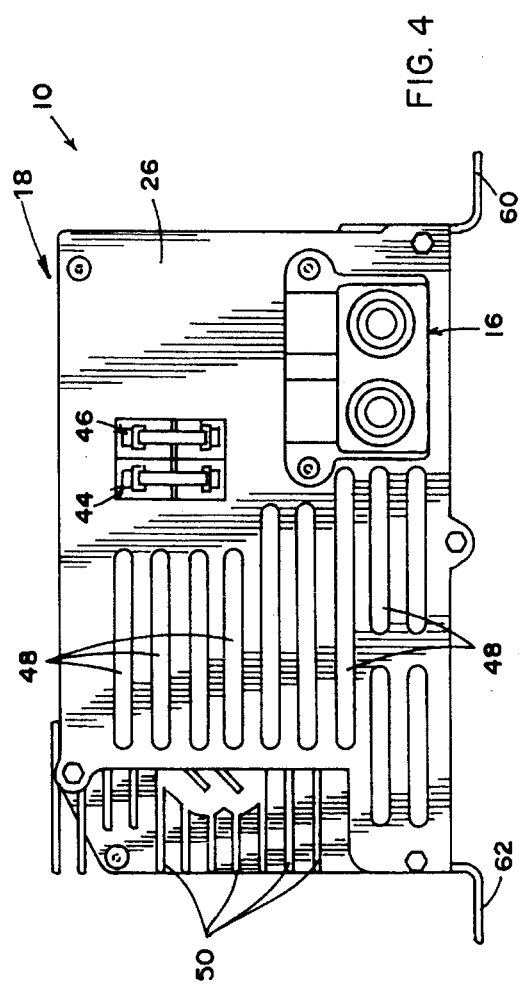
FIG. 4 is an end elevational view of the power converter according to FIG. 1.
Figure 5:
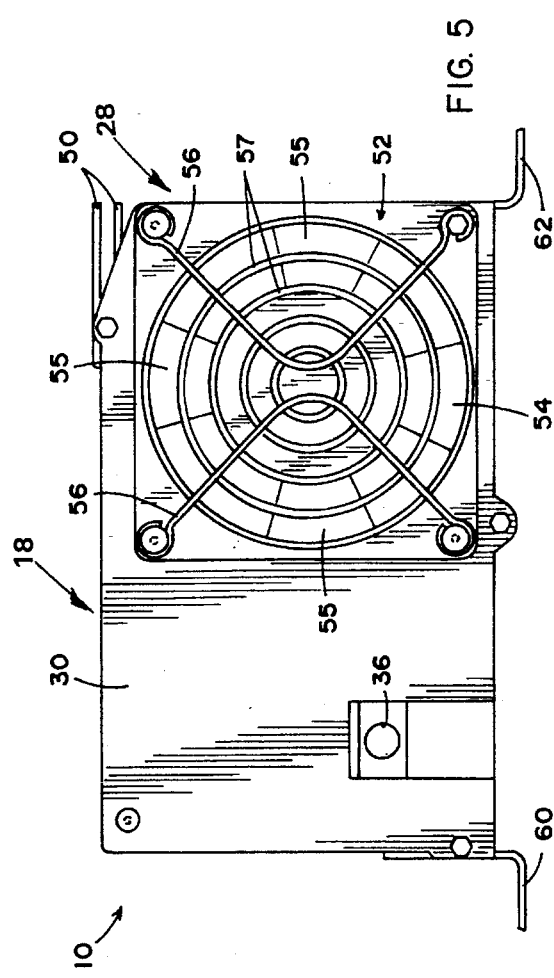
FIG. 5 is an opposite end elevational view of the power converter according to FIG. 4.

Somewhat more particularly, the switched power converter 10 includes a housing 18 (FIG. 2) which encloses and protects the switched power converter circuit 20 (FIG. 3) mounted on circuit board 22. The housing 18 includes a top wall 24 (FIG. 2), an end wall 26 and a front wall 28. Front wall 28 includes cooling fins 50 (only some of which are numbered), which dissipate heat generated by the switched power converter circuit 20 (FIG. 2). The fins are oriented to project orthogonally outward from the front wall 28 to provide a large heat dissipation surface area in a small volume. The fins 50, front wall 28 (FIG. 4a), and bottom wall 29, are preferably integrally formed of any suitable metal, such as aluminum. An end wall 30 (FIG. 5) is opposite end wall 26 (FIG. 4). The back wall 31 (FIG. 3) and bottom walls (not shown) are generally planar, rectangular members. The walls of housing 18 are manufactured of a suitable metal, such as an aluminum alloy, which conducts heat and is light in weight. Those skilled in the art will recognize that other suitable materials could be used. The housing has a height of approximately 4 inches, a length of approximately 8 inches, and a width of approximately 7 inches, such that it is relatively compact for ease of mounting in a vehicle.

The DC outputs 32, 34 (FIG. 3) of the converter circuit 20 are positioned within DC output block 16 (FIGS. 3 and 4) and are accessible through end wall 26. End wall 26 also supports fuses 44 and 46 which are conventional 30 amp fuses of the type used in automobiles. These fuses are connected to the DC output 32 of the switched power converter 10, as described in greater detail hereinbelow. End wall 26 includes apertures 48 (FIG. 3, only some of which are numbered) which vent to the interior of the housing.

A fan housing 52 (FIGS. 3 and 5) is mounted to end wall 28. Fan housing 52 houses a fan 54 which blows cooling air over the components of circuit 20 mounted on circuit board 22. The air moved through housing 18 by fan 54 is vented through apertures 48. Two protection members 56 are connected over the grill 57 of housing 52 to assist in protecting the blades 55 of fan 54, by making the access openings through which the fan draws air smaller. End wall 30 includes an opening 36 (FIG. 5) for passage of electrical cable 14 (FIG. 1) which is used to connect the power converter to an AC wall outlet.

A pair of feet 60, 62 (FIG. 3) extend downwardly and outwardly from the front wall 26 and the back wall 30. Feet 60, 62 each include slots 64 for receipt of mechanical connectors, such as screws (not shown), which are used to fasten housing 18 to a support surface in recreational vehicle 11. The feet thus provide a stable platform by which the power converter is mounted. The feet 60 and 62 may be formed integrally with one or more of bottom wall (not shown), the front wall 26, or the back wall 30, or the feet may be attached to one or more of these walls using a suitable conventional connecting means such as welding.

Having briefly described the overall preferred mounting environment of the switched power converter circuit 20 and its relation to vehicle 11, a description of the power converter circuit will be described initially with reference to FIGS. 6A–6C, and subsequently with reference to FIG. 8.

The switched power converter circuit 20 (FIG. 6A) includes a switched power supply circuit having a switch 80, an inductor L1 and a capacitor C6. Switch 80 is controlled by flip-flop 71 connected to an oscillator 70. Oscillator 70 generates impulses having a substantially zero time duration which are input to input 73 of a flip-flop 71. Flip-flop 71 includes NORgates 72 and 74. NORgate 74 has an input 75 connected to the output of a comparator 154. The output 77 of the flip-flop 71 controls switch 80 such that switch 80 is closed when output 77 is at a high logic level and switch 80 is open when output 77 is at a low logic level. When switch 80 is closed, the potential from DC source 82 is connected to inductor L1. The switched power supply also includes capacitor C6 which charges to ground through current sense resistor R7 when the inductor L1 current exceeds the load current. The inductor's current builds when switch 80 is closed. The stored energy in inductor L1 is transferred to the load, capacitor C6, resistor R7 and diode D. Capacitor C6 has an average DC current of 0 amps such that it smooths the output current to the load, charging when the current in inductor L1 exceeds the load current and discharging to the load when the inductor current drops below the load current.

Feedback is provided from output 32 to flip-flop 71 for controlling the pulse energizing switch 80. This feedback is provided through a buffer amplifier 133. The output of the buffer amplifier 133 is compared to a fixed reference voltage in a differential amplifier 134. So long as the output voltage at output terminal 32 of the switched power converter is less than the reference voltage at the non-inverting input of differential amplifier 134, amplifier 134 generates a positive voltage at the output thereof. This output voltage is proportional to the difference between the inverting and non-inverting inputs of amplifier 134. The output of amplifier 134 is referred to herein as the voltage controlled current limit. An inverting input of a comparator 154 is connected to the output of amplifier 134.

The signal at the inverting input of amplifier 154 is limited to a reference level, which is referred to herein as the absolute current limit. The absolute current limit is set by the reverse breakdown voltage of Zener diode 86 in FIG. 6A. If the voltage controlled current limit exceeds the absolute current limit, the Zener diode sets the voltage level at the inverting input of comparator 154. The non-inverting input of comparator 154 is connected to a current sense resistor R7. The voltage across resistor R7 is compared to voltage controlled current limit or the absolute current limit, whichever is less. If the voltage across resistor R7 exceeds the signal at the inverting input of comparator 154, the output of comparator 154 is switched to a high logic level. The high logic level output of comparator 154 is applied to input 75 of flip-flop 71, which controls output 77 to have a low logic level. This low logic level signal controls switch 80 to open. So long as input 75 is at a low logic level, the current through resistor R7 will continue to rise. When the current through resistor R7 produces a voltage across resistor R7 which exceeds the voltage controlled current limit, or the absolute current limit, at the inverting input of comparator 154, switch 80 is open. The voltage at the inverting input of comparator 154 thus controls the average current level in the inductor, which average current level is the load current. Thus, the pulse width of the output signal of flip-flop 71 will vary depending on the current through inductor L1, and the pulses output by flip-flop 71 are dependent upon the current through resistor R7, the voltage controlled current limit and the absolute current level.

Figure 6A:
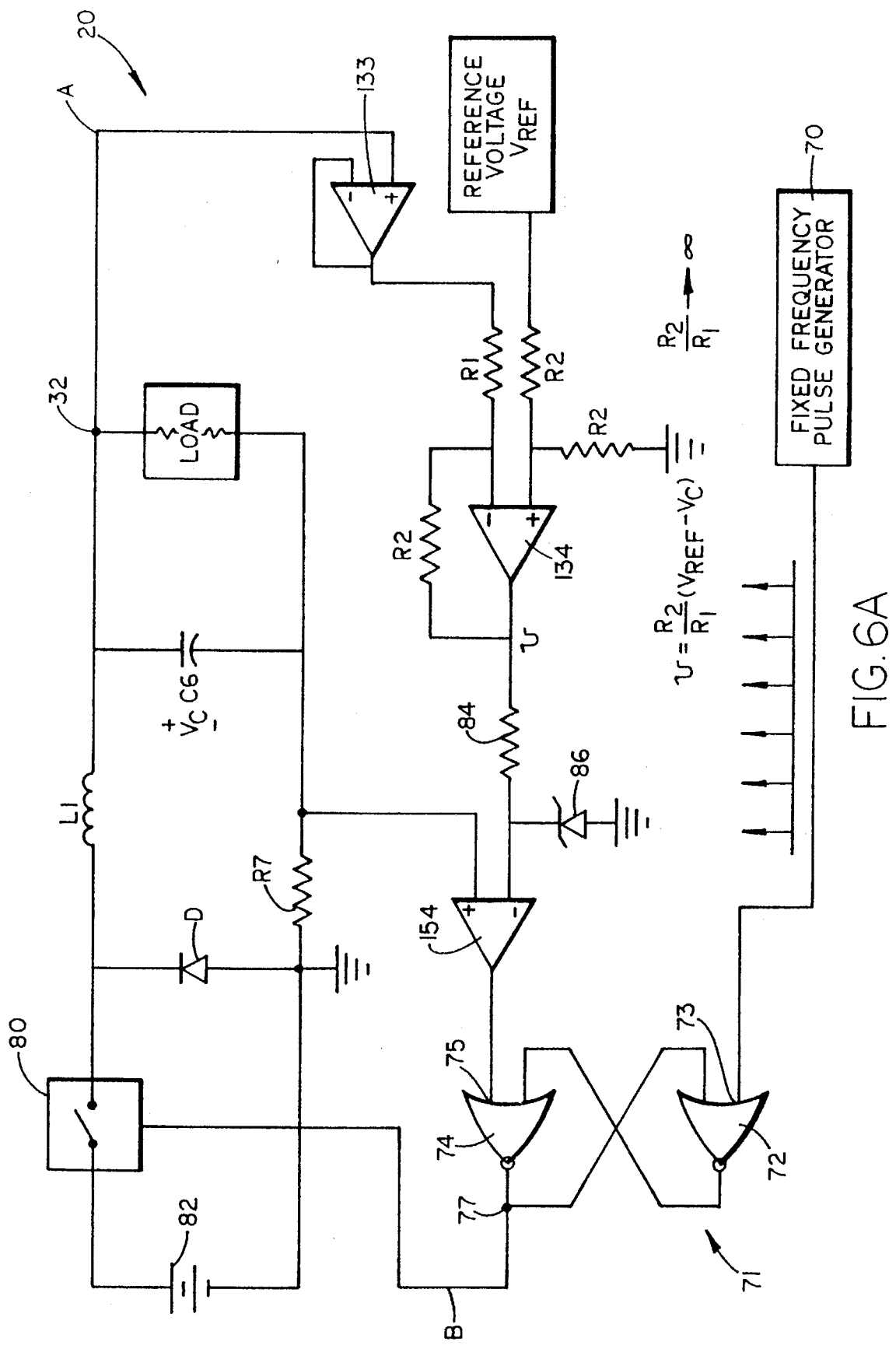
FIG. 6A is a schematic circuit diagram, partially in block diagram form, of a portion of the switched power converter according to FIG. 2.
Figure 7A:
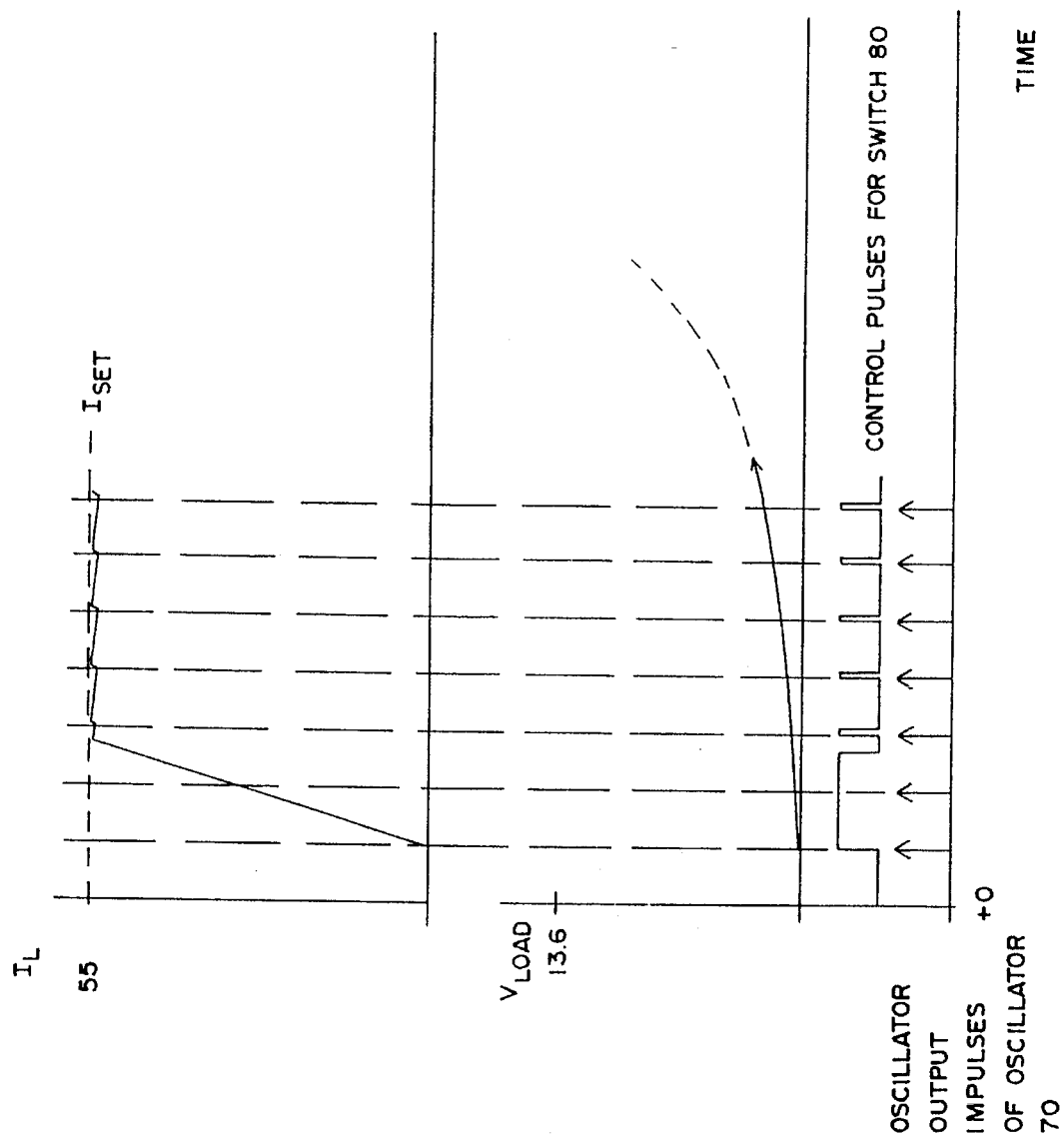
FIG. 7A is a timing diagram illustrating signals associated with the switched power converter according to FIG. 6A.

In operation, when the converter 10 is initially, properly connected to a load, the inductor will rise quickly to the current limit $I_{set}$ (FIG. 7a). The voltage at the output 32 requires a number of duty cycles of the impulses on the output of oscillator 70 (FIG. 6A) before the output (FIG. 7A) reaches the regulated output level of approximately 13.6 V. Until the output voltage reaches the regulated output level, the inductor will fluctuate near the $I_{set}$ current level. The current is set by the voltage feedback circuit which is slow and has a high gain. This feedback circuit controls the voltage at the inverting input of amplifier 154 which controls load current, such that:

| CASE | RESPONSE | RESULTS |
| --- | --- | --- |
| $V_{REF} - V_{OUT} > 0$ | increase voltage at inverting input of amplifier 154 | increase current to load |
| $V_{REF} - V_{OUT} < 0$ | decrease voltage at inverting input of amplifier 154 | decrease current to load | wherein $V_{REF}$ is the voltage at the inverting input of amplifier 154 and $V_{OUT}$ is the output voltage at terminal 32. The voltage at the inverting input of amplifier 154 will vary from 1 to 3 volts to control the load current to be within 0–55 amps.

If the output terminals 32, 34 (FIG. 3) are connected to a battery 13 (FIG. 1) in reverse, or if a short circuit condition exists across the output terminals 32, 34 (FIG. 2), the output voltage at terminal 32 will be connected to a voltage below the reference voltage immediately, causing the error signal at the output of comparator 134 to be large, which would command very large currents in the absence of Zener diode 86. However, even with the absolute current limit set by Zener 86, a very large current is shorted to reference ground through the load and the current sense resistor R7. This causes the voltage across resistor R7 to rise very quickly. Consequently, the voltage across resistor R7 will quickly exceed the limit set by Zener diode 86. When the voltage across resistor R7 exceeds the limit set by Zener diode 86, the signal level at input 75 will have a high logic level. This holds output 77 low, which in turn holds switch 80 open throughout most of the time period between the impulses output by oscillator 70. It can thus be seen that the transient and steady state duty cycle are controlled by the power circuit and the current limit. The on time during a short circuit is very short because all the voltage is used to increase the current in the inductor L1. The off time is very long because there is only a nominal voltage across the inductor to bring it down.

Figure 6B:
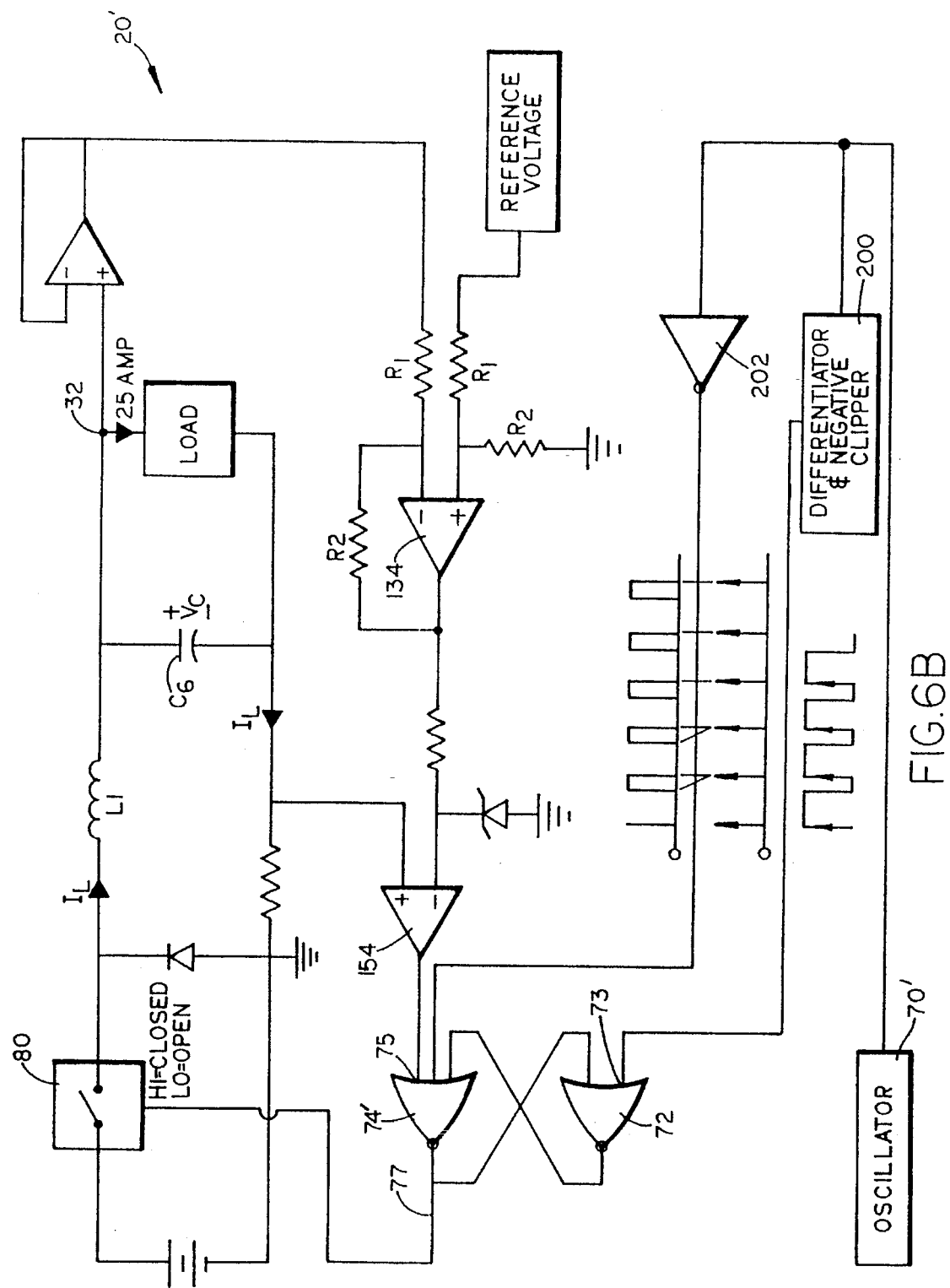
FIG. 6B is a schematic circuit diagram, partially in block diagram form, of an alternate embodiment of the portion of the power converter according to FIG. 6A.

A switched power converter 20' according to an alternate embodiment of the circuit of FIG. 6A is illustrated in FIG. 6B. This embodiment has an intrinsic duty cycle limit. This circuit includes an oscillator 70' which outputs a longer duty cycle pulse than impulses output by oscillator 70 in FIG. 6A. The output pulses of oscillator 70' are input to a differentiator and negative clipper 200 which outputs substantially zero time duration impulses on the leading edge of the pulses output by oscillator 70'. These impulses are input to NORgate 72 of flip-flop 71. The outputs of oscillator 70' are also input to inverter 202. The output of inverter 202 is connected to a one input of a three-input NORgate 74' of flip-flop 71. If any input to NORgate 74' goes to a high logic level, the output of flip-flop 71 goes low, holding switch 80 open until the next impulse is input to NORGATE 72. The signal output by inverter 202 creates an intrinsic duty cycle, as the pulse output by inverter 202 resets output 77 of flip-flop 71 to a low level a predetermined time period before the end of each duty cycle, even if the output of comparitor 154 remains low.

Figure 7B:
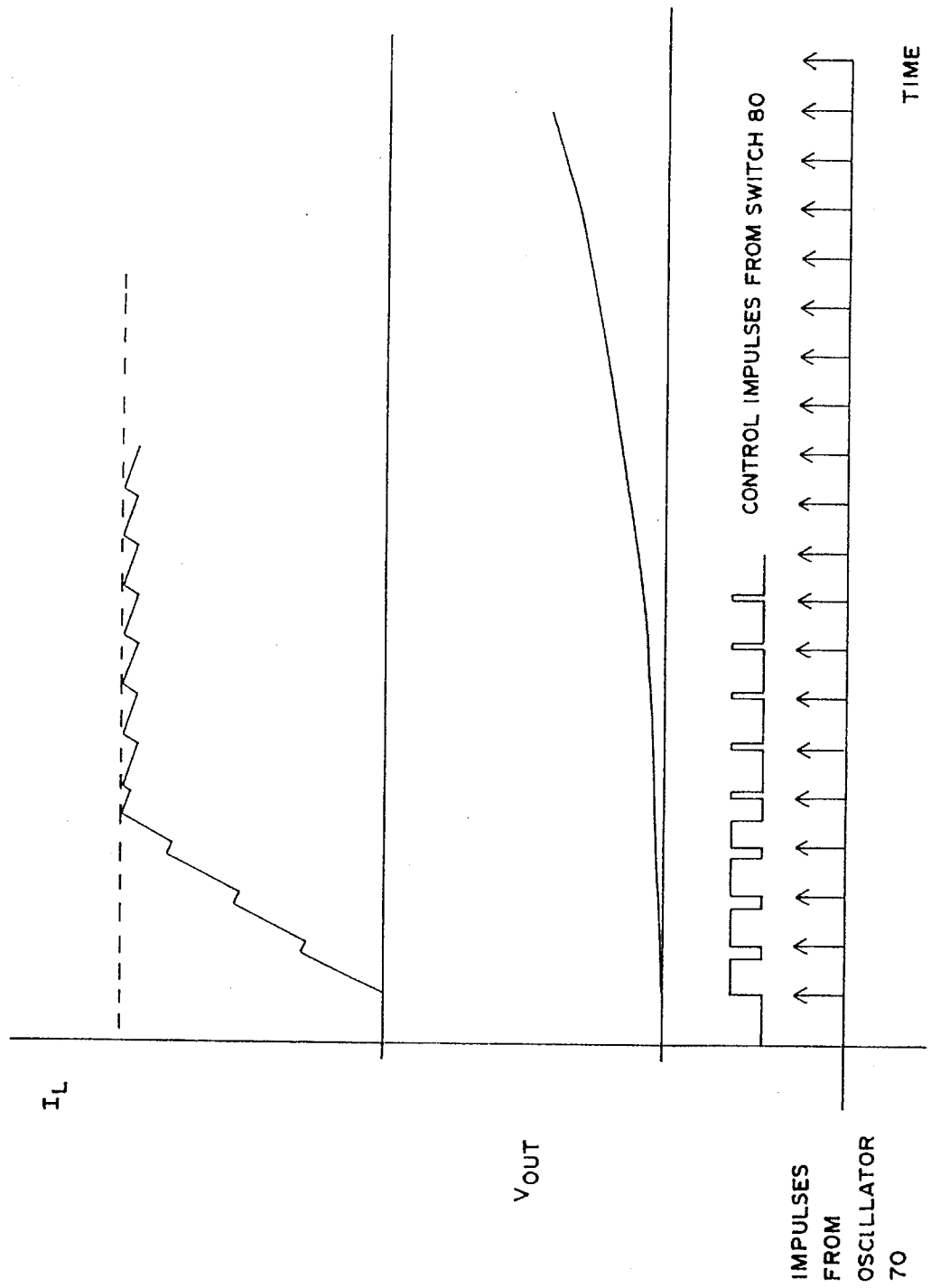
FIG. 7B is a timing diagram illustrating timing signals associated with the switched power converter according to FIG. 6B.

As illustrated in FIG. 7B, at turn on, the inductor current $I_L$ will rise until the output of inverter 202 goes to a high logic level. When the output of inverter 202 goes to a high logic level, switch 80 opens. At the next impulse output by differentiator and negative clipper 200, switch 80 closes and the inductor current $I_L$ rises until the output of the inverter goes to a high logic level. This cycle is repeated until the absolute current limit is reached. The power converter output current will remain near the absolute current limit until the output voltage drops below the absolute current limit. In this embodiment, it can be seen that the duty cycle of the control pulses of swish 80 cannot exceed the duty cycle of oscillator 70. The embodiment of FIG. 6B is required for push-pull transformer circuits which include two switches, as this embodiment insures that the control pulses to both switches of the push-pull transformer circuits are limited such that both switches are not closed at the same time.

Figure 6C:
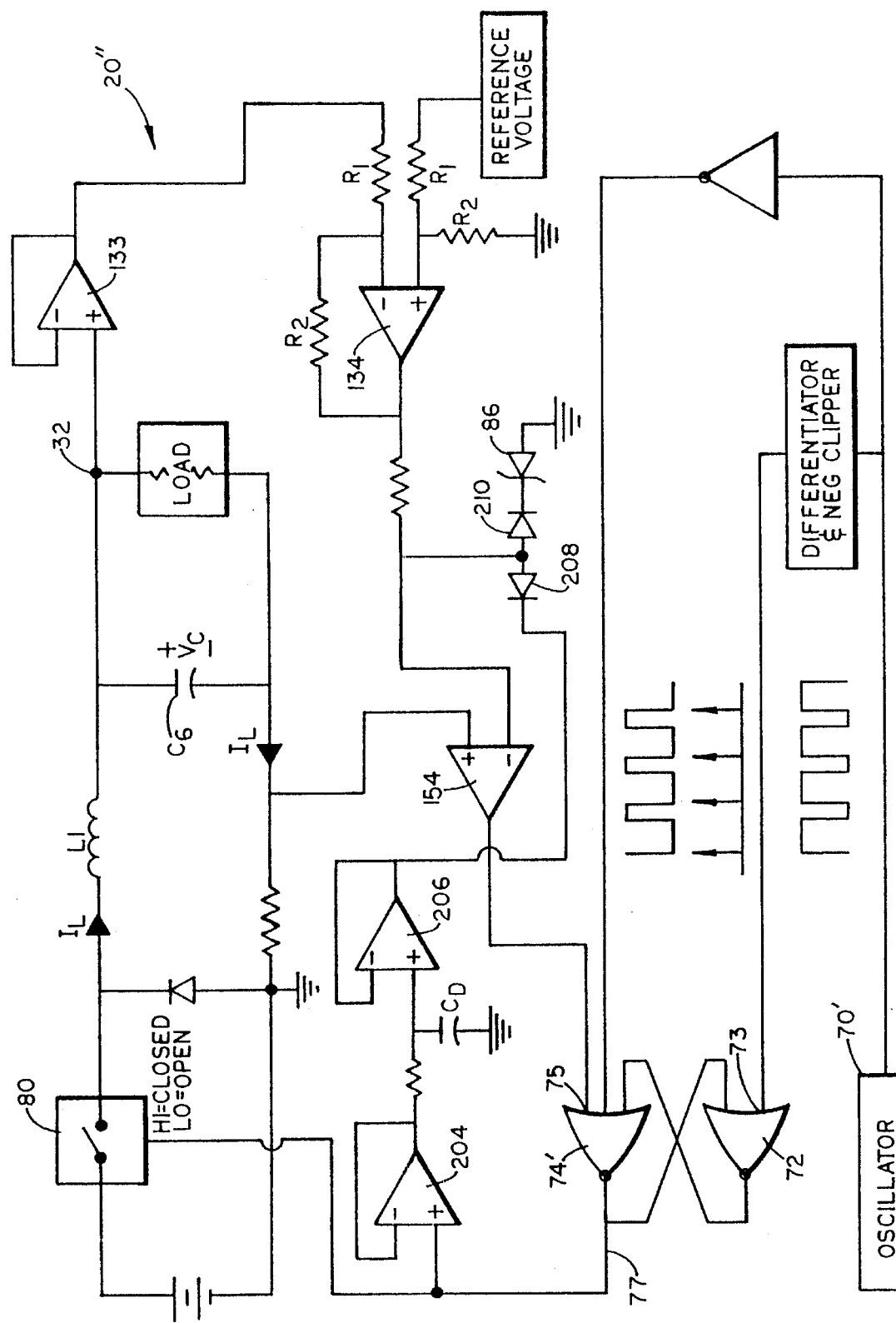
FIG. 6C is a schematic circuit diagram partially in block diagram form, of another alternate embodiment of the portion of the circuit according to FIG. 6A.

Another switched power converter embodiment 20" having an intrinsic duty cycle is illustrated in FIG. 6C. This circuit adds a duty cycle controlled current limit. The duty cycle controlled current limit is provided by a feedback circuit including amplifier 204, capacitor $C_D$, amplifier 206, and diodes 208 and 210. Diodes 208 and 210 selectively connect Zener diode 86 and the output of amplifier 206 to the inverting input of amplifier 154.

Figure 7C:
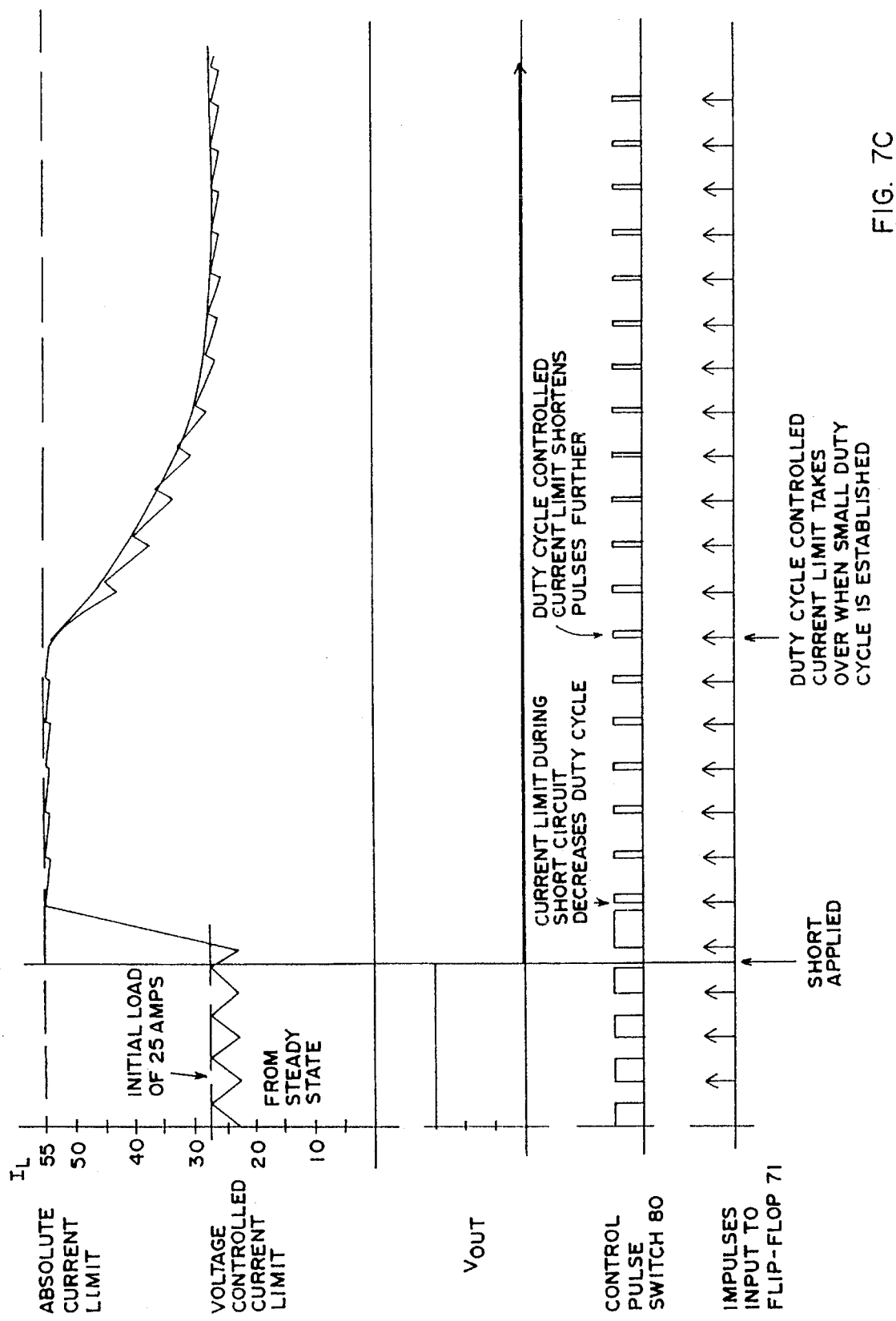
FIG. 7C is a timing diagram illustrating signals associated with the switched power converter according to FIG. 6C.

During normal operation, the voltage controlled current limit set by the output of amplifier 134 controls the inductor current to be near the DC output current, say, for example, 25 amps. During such operation capacitor $C_D$ charges to a relatively high level because of the relatively long duty cycle of the control pulses for switch 80. When output 32, 34 is shorted, or there is a reverse connection, the inductor L1 current rises quickly to the absolute current limit set by Zener diode 86, the output voltage is zero volts, and the duty cycle is shorter. The absolute current limit in combination with zero output volts results in a short duty cycle for switch 80. The capacitor $C_D$ will discharge to a lower level because of this short duty cycle. When capacitor $C_D$ has discharged to the level where the output of amplifier 206 is less than the reverse breakdown voltage of Zener diode 86, the duty cycle controlled current limit of capacitor $C_D$ takes over. The duty cycle controlled current limit will then lower the current limit below the absolute current limit. This somewhat further shortens the duty cycle of switch 80, which lowers the output voltage, as shown in FIG. 7C. It will be recognized by those skilled in the art that Zener diode 86 limits the feedback signal. However, it will not directly limit the duty cycle. For example, a 0.2 Ohm load on the output would have a current level set by Zener diode 86, but the circuit would have a large duty cycle.

The power converter according to the most preferred embodiment of the invention will now be described in greater detail with reference to FIG. 8. The power converter circuit 20 includes a main power path which passes through transformer T1. The main power path on the primary winding 122 side of transformer T1 passes through an AC/DC converter input circuit 83. The AC/DC output potential at pin 115 is connected through a fuse F3 to the center tap 120 of a winding 122. The potential at center tap 120 creates a current through half of winding 122, switch Q1 or switch Q2, and resistor R6 to ground. Switch Q1 and switch Q2 implement switch 80 in FIG. 6, and control current flowing through transformer T1. The main power path on the secondary winding side 124 (FIG. 8) of transformer T1 is connected through inductor L1 and capacitor C6, which are the energy storage elements noted above with respect to FIG. 6. The junction 130 of energy storage elements L1 and C6 is connected to the output terminal 32 through output section 94. The junction 130 is also connected to feedback control section 96. A fan control circuit 98 is connected to junction 130 and selectively provides power to the fan 54.

Figure 8:
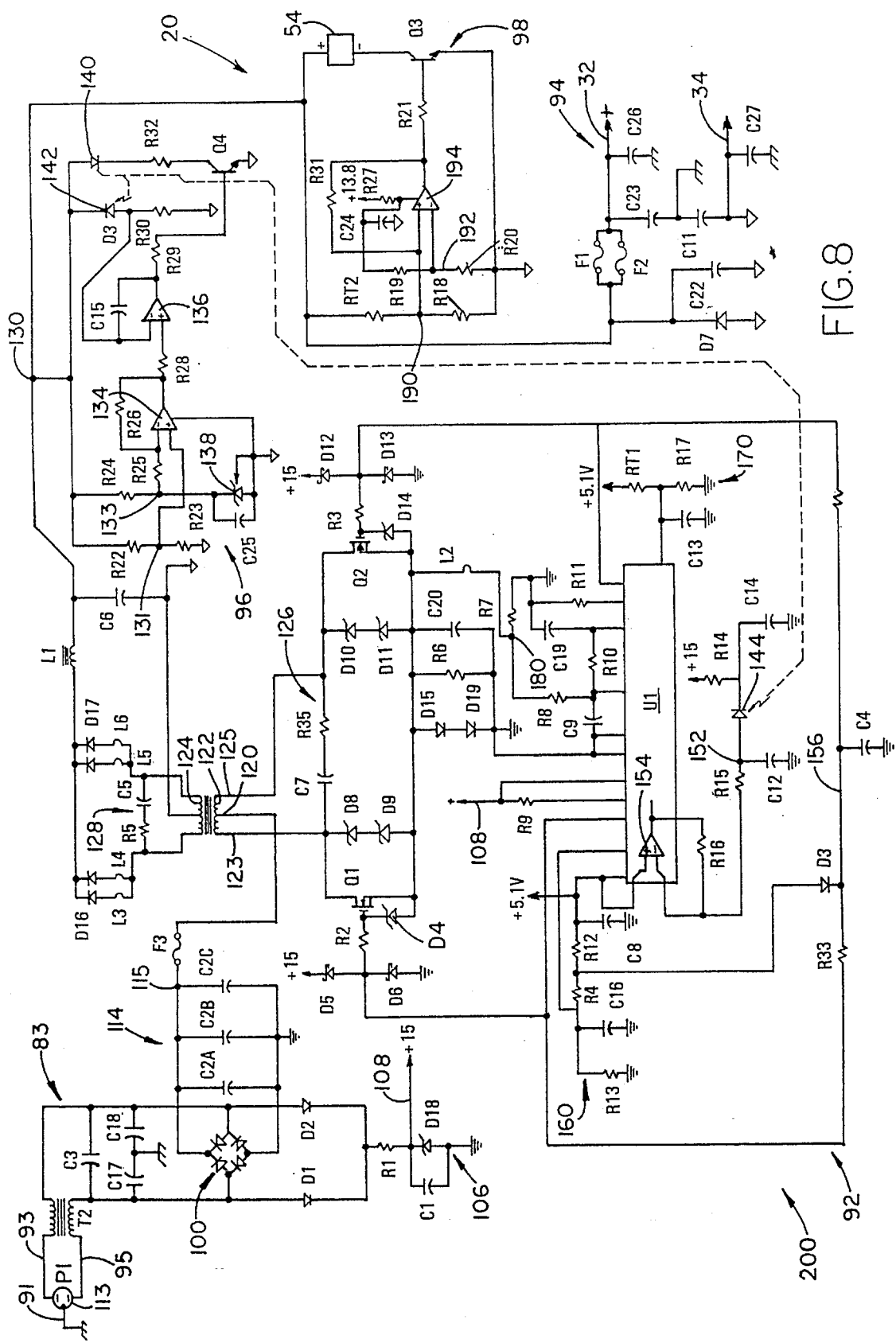
FIG. 8 is a schematic circuit diagram of the circuit for the power converter according to FIG. 1.

Still more particularly, and with continued reference to FIG. 8, input circuit 83 is connected to a conventional AC power supply by cable 14. Cable 14 includes a connector 113 having a safety ground conductor 91 internally connected to chassis ground and connected to the safety ground of a 110 VAC supply 112 through connector 113. The cable 14 also includes a power conductor 93 and neutral conductor 95 which are connected to the power and neutral terminals of power supply 112. The power and neutral conductors are connected through a noise suppression transformer T2. Additional noise suppression is provided by capacitors C3, C17 and C18. Capacitor C3 is connected to one plate of each of capacitors C17 and C18. The other plates of capacitor C17 and C18 are connected to chassis ground. These capacitors C3, C17 and C18 provide electromagnetic interference (EMI) noise suppression, and filter noise components which would otherwise be output on the AC line to which the power supply is connected, in conjunction with the filtering provided by transformer T2.

The windings of transformer T2 are connected to the anodes of diodes D1 and D2. The cathodes of diodes D1 and D2 are connected to resistor R1 of a voltage regulator 106. Resistor R1 is connected to a capacitor C1 and a Zener diode D18. Capacitor C1 filters the voltage across diode D18 to stabilize this voltage. The output 108 of regulator 106 is connected directly to pin 15 of integrated circuit U1 and through a resistor R9 to pin 13 of integrated circuit U1. Regulator 106 generates a 15 volt power supply for integrated circuit U1, which voltage is set by the reverse breakdown voltage of Zener diode D18.

A rectifier bridge 100 includes output ternfinals connected to a capacitor array 114. Capacitor array 114 includes capacitors C2a, C2b and C2c connected in parallel between the positive output terminal 115 of bridge 100 and input reference ground. These capacitors filter the rectifier output. Terminal 115 is connected through a fuse F3 to the center tap 120 of the primary winding 122 of transformer T1. The transformer T1 is preferably constructed of LITZ wire for skin effect. The primary winding 122 is constructed of 13 turns of 52 strand #36 LITZ wire. The secondary winding 124 is constructed of 2 turns of 4×80 strand #36 LITZ wire. In one reduction to practice, the transformer included two E cores which were interconnected, and therefore included a very small gap. Most preferably, a gapless transformer would be utilized. The ends 123 and 125 of the primary winding 122 are connected to MOSFET elements Q1 and Q2, respectively. The center tap of the secondary winding 124 of transformer T1 is connected to output reference ground. The secondary winding of transformer 124 is connected to the energy storage components L1 and C6 through Ferrite beads L3–L6 and diodes D16, D17. The ferrite beads L3–L6 on the anode lead of diodes D16, D17 provide a small inductance which effects EMI noise suppression and reduces radiated noise. The diodes select the side of secondary winding 124 that will input energy to inductor L1. The oscillating output current from diodes D16, DI7 charges inductor L1 such that this energy storage element charges when MOSFET elements Q1 or Q2 are "ON" and discharges when Q1 and Q2 are "OFF." Capacitor C6 will charge when the inductor current exceeds the output current to the load and discharges when the inductor current drops below the output current level (the average current of capacitor C6 is zero and the average current in inductor $L_1$ is equal to the average load current).

Power snubbers 126 and 128 are connected to the primary winding 122 and the secondary winding 124 of transformer T1. Power snubber 126, including a capacitor C7 and a resistor R35 connected in series, is connected in parallel with the primary winding 122. Power snubber 128, including a resistor R5 and a capacitor C5 connected in series, is connected in parallel with winding 124. The power snubbers protect MOSFET elements Q1 and Q2 and suppress EMI noise by filtering the signal across the windings of the transformer. The cathodes of diodes D16, D17 are connected to one terminal of inductor L1. The other terminal of inductor L1 is connected to terminal 130. Capacitor C6 is connected between terminal 130 and output ground 34.

Output section 94 is connected to terminal 130. Output section 94 includes two 30 amp fuses F1 and F2, which are connected to the output 32 to protect the switched power converter against large currents which occur if the positive terminal 32 and ground terminal 34 are incorrectly connected to the negative and positive terminals of battery 13 (FIG. 1) in trailer 11. The fuses are preferably 30 amp fuses of the type utilized in automobiles, which are inexpensive and readily available from retailers who sell automotive parts. It will be recognized by those skilled in the art that diodes in the output circuit prevent the battery from supplying power to the converter if the coupler is correctly connected to the battery. It will also be recognized that the current limit prevents the power converter from outputting sufficiently large currents to interrupt the fuse. The fuses F1 and F2 thus only interrupt the power supply in a reverse battery situation.

The output section 94 also includes output capacitors C11, C22, C23, C26 and C27 connected to the output 32 and output reference ground terminal 34. These output capacitors provide additional EMI noise suppression and filtering of the regulated output signal. The negative plates of capacitor C11, C23, C26 and C27 are connected to chassis ground.

A diode D7 is connected to the output. The cathode of diode D7 is connected to the ground terminal output 34 and the anode of diode D7 is connected to terminal 130. Diode D7 is thus connected in parallel with capacitor C6. Diode D7 is normally reverse biased. However, if the positive output 32 and the ground output 34 are connected to the negative and positive terminals of battery 13, respectively, diode D7 is switched into a conducting state, and shorts capacitor C6. This diode provides a novel circuit to prevent current from flowing to the transformer and also protecting capacitor C6, which is preferably a 2200 uF, 16 V, aluminum electrolytic capacitor, during a reverse battery condition.

The feedback control 96 includes resistors R22 and R23 connected in series between junction 130 and output ground 34. The junction 131 of resistors R22 and R23 is connected to the non-inverting input of amplifier 134. The inverting input of amplifier 134 is connected through a resistor R25 to the junction 133 of resistor R24 and the cathode of a Zener diode 138. Zener diode 138 is connected in parallel with an integrating capacitor C25 and sets the reference voltage for comparator 134. A resistor R26 is connected between the output and the inverting input of amplifier 136. Differential amplifier 134 generates an error signal which is proportional to the difference between the signal at junction 131 and the reference signal set by Zener diode 138. The signal at junction 131 is directly proportional to the signal level at junction 130. The output of amplifier 134 is:

$$V_{out134}=V_{zener}+(V_{131}-V_{zener})(1+R_{26}/R_{25})$$

wherein: $V_{out134}$ is the output voltage of amplifier 134;
$V_{zener}$ is the reverse breakdown voltage of Zener diode 138;
$V_{131}$ is the voltage across resistor R23;
$R_{26}$ is the resistance of resistor R26;
$R_{25}$ is the resistance of resistor R25

Inasmuch as $V_{zener}$, $R_{26}$ and $R_{25}$ are fixed, it can be seen that $V_{out\ 134}$ varies with $V_{131}$, and thus $V_{out134}$ is proportional to the voltage at junction 130.

The output voltage $V_{out134}$ of amplifier 134 is connected to the non-inverting input of an amplifier 136 through a resistor R28. The output of amplifier 136 is connected to the base of an NPN transistor Q4. A capacitor C15 is connected between the output and the inverting input of amplifier 136 for stability of the feedback loop connected to amplifier 136. It will be recognized that the feedback loop is R29, Q4, 148, 142 and pin 15, and that C15 is added for stability of this feedback loop. A base resistor R29 is connected between the output of amplifier 136 and the base of transistor Q4. The collector of transistor Q4 is connected to a resistor R32 which, in turn, is connected to the cathode of a light emitting diode (LED) 140. LED 140 is optically coupled to a photo detector diode 142 and a photo detector diode 144. The photo detector diode 144 generates a feedback signal input to an Integrated Circuit (IC) U1. Photo detector 142 is connected between junction 130 and a resistor R30. The junction of resistor R30 and diode 142 is connected to the inverting input of amplifier 136.

Resistor R32, LED 140, and photo detector 142 provide a feedback loop for the voltage controlled current source including amplifier 136 and transistor Q4. The current output $I_{diode\ 142}$ is controlled by the feedback loop including photodiode 142 and resistor R30 such that:

$$I_{diode\ 142}=V_{out134}/R_{30}$$

wherein: $I_{diode142}$ is the current through diode 142;
$V_{out134}$ is the output voltage of amplifier 134; and R30 is the resistance of resistor R30.

Photo detector diodes 142 and 144 are matched, and are preferably in a common integrated circuit, whereby the photocurrents through the diodes are such that:

$$I_{diode\ 142} = I_{diode144}.$$

The photocurrent $I_{diode144}$ is thus dependent on $V_{out134}$ and independent of the photocoupler characteristics. Because the photo currents of diodes 142 and 144 are proportional to $V_{out134}$, and $V_{out134}$ follows $V_{131}$, the performance variations of the photocoupler which occur due to aging will not effect the magnitude of the current input to the integrated circuit U1 responsive to a certain voltage at junction 131.

The feedback circuit includes a pull-up resistor R14 connected between the 15 volt power supply terminal 108 and the cathode of photo diode 144. A capacitor C14 is connected between the cathode of diode 144 and ground. The anode of diode 144 is connected to the junction 152 of a resistor R15 and a capacitor C12. Resistor R15 is connected to the inverting input of an internal differential amplifier 154. A resistor R16 is connected to pins 7 and 6 of the integrated circuit to provide an impedance connected between the output and the inverting input of the internal differential amplifier.

Switching control circuit 92 includes an integrated circuit U1 which is responsive to the current signal from photo diode 144, input through resistor R15, and a current feedback input through a Ferrite bead L2 and a resistor R8, for generating control pulses at output pins 11 and 14. The pulse controller may be provided by a commercially available circuit such as integrated circuit (IC) No. UC 3846 commercially available from Unitrode Corporation. The power supply for the integrated circuit is provided from the 15 volt DC supply 106, as described hereinabove. A frequency control of the circuit is provided by resistor R11 and capacitor C19. Resistor R11 preferably has a resistance of approximately 1.82 Kohm and capacitor C19 preferably has a capacitance of approximately 0.012 uF. Resistor C19 and capacitor R11 are connected to pins 8 and 9 of the integrated circuit. The circuit also includes a slope compensation resistor R10, connected between pins 3 and 4 of the integrated circuit. The slope compensation resistor preferably has a resistance of approximately 47 Kohm. The slope compensation resistor in the current feedback circuit is necessary for stability of the inner current loop when duty cycles are greater than 50%.

The current feedback to the integrated circuit U1 is provided by inductor L2, resistor R7, resistor R8 and capacitor C9 and sense resistor R6 (0.05 Ohm). Resistor R7 has a small resistance of approximately 1.8 Ohm and has a current thereacross proportional to the current at output 32. Ferrite bead L2 is attached to the conductor extending between the source of MOSFETs Q1 and Q2 and the junction 180 of resistors R7 and R8. The bead L2, like beads L3–L6, has an inductance of approximately 1 to 3 uH, and filters switching spikes. Resistor R8 is connected to pin 4 of integrated circuit U1. Resistor R7 is connected between junction 180 and circuit ground. Capacitor C9 is connected between pins 4 and 3 (ground) of integrated circuit U1. Capacitor C9 provides noise suppression by integrating the input signal at pin 4 of integrated circuit U1.

The voltage at pin 7 controls the current. If the voltage at pin 7 remains constant, the current supplied to the output 32 will remain constant regardless of the voltage at output 32. More particularly, amplifier 154 creates an offset in the error signal such that:

$$V_{out154} = 5.1 - I_{diode144} R_{16} = 5.1 -$$

$$\frac{R_{16}}{R_{30}} (V_Z + (V_{131} - V_Z)(1 + R_{26}/R_{25})) = 3.86 - (42.25)(v_{131} - 1.244)$$

Accordingly: if $V_{out154}$=3 V (55 amps), $V_{131}$=1.2644 or $V_{out}$=13.17 V if $V_{out154}$=1 V. (0 amp), $V_{131}$=1.3117 or $V_{out}$=13.66 (open circuit voltage).

wherein:
$V_Z$=1.244 is the reference Zener 138;
$V_{131}$ is the voltage at junction 131;
$V_{out154}$ is the output voltage of amplifier 154;
$I_{diode\ 144}$ is the current through diode 144;
$R_{16}$ is the resistance of resistor $R_{16}$, and is 39 Kohm in the preferred embodiment;
$R_{25}$ is the resistance of resistor $R_{25}$, and is 2 Kohm in the preferred embodiment;
$R_{26}$ is the resistance of resistor $R_{26}$ and is 82.5 Kohm in the preferred embodiment;
$R_{30}$ is the resistance of resistor $R_{30}$, and is 39 Kohm in the preferred embodiment.

The voltage output of amplifier 154 controls the current output of the power converter. If $V_{154} \approx 3$ V, the current output is 55A. If $V_{154} \approx 1$ V, the current output is 0 Amp. At startup $V_{154}$ is greater than 3 V.

An absolute current limit, which is represented by Zener diode 86 in FIGS. 6A–6C, is set by resistors R13, R4, R12 and capacitors C8, C16 in a normal duty cycle, or also including resistors R33, R34 and capacitor C4 when the duty cycle is short, in FIG. 8. Capacitor C4 charges through resistors R33 and R34. In the preferred embodiment, capacitor C4 has a capacitance of approximately 0.1 uF and resistor R33 and R34 have a resistance of approximately 4.7 Kohm. In a short duty cycle condition, capacitor C4 does not charge up to a potential exceeding 4.1 volts (the voltage at the anode of diode D3). If diode D3 is reverse biased:

$$V_{anode} = \frac{R_{13} + R_4}{R_{13} + R_4 + R_{12}} (5.1V) = 4.1 \text{ volt}$$

wherein: $R_{13}$ is the resistance of $R_{13}$;
$R_4$ is the resistance of $R_4$;
$R_{12}$ is the resistance of $R_{12}$.

When D3 is reversed biased, the average voltage of C4 is equal to the average voltage of pins 11, 14. When D3 is forward biased, the average voltage across C4 is more than the average voltage of pins 11, 14. When the average voltage of pins 11 and 14 are low enough such that D3 conducts, then current flows through D3 increasing the voltage on C4 above the average of pins 11 and 14. However, it still lowers the voltage in D3 anode from the reverse biased condition and therefore brings down the current limit. Thus, diode D3 will be forward biased during a short duty cycle, and the lower voltage at the anode plate of capacitor C4 sets the absolute current limit. This lower voltage is applied to the junction of resistors R4 and R13 such that the absolute current limit at pin 1 is lowered during short duty cycle conditions. However, during normal duty cycles, capacitor C4 will charge up to a potential such that diode D3 is reversed biased, and the current limit is set by the 5.1 volt output voltage at pin 2.

In a short circuit condition, the current through resistor R7 will rise quickly, reaching a level equal to the level of the absolute current limit very rapidly because of the large current which flows through the small importance presented by the short circuit load.

It is the charging and discharging of the inductor to the current limit that determines the steady state and transient duty cycle and this is controlled by the voltages as shown. For FIG. 6, in a short circuit condition:

$$\frac{dI_L}{dt}\bigg|_{up} = \frac{1}{L} V_{BATT} \approx 1.2 \frac{amp}{usec}$$

$$\frac{dI_L}{dt}\bigg|_{down} = \frac{1}{L} V_{diode} \approx -.035 \frac{amp}{usec}$$

whereas, in normal operation:

$$\frac{dI_L}{dt}\bigg|_{up} = \frac{1}{L} (V_{BAT} - V_{out}) \approx 0.525 \frac{amp}{usec}$$

$$\frac{dI_L}{dt}\bigg|_{down} = \frac{1}{L} (V_{out} + V_{diode}) \approx -0.71 \frac{amp}{usec}$$

wherein, L=20 uH $$\frac{dI_L}{dt} = rate of change of inductor L current$$

$V_{diode} \approx 0.74$ volt≈forward voltage drop of diode D16 and/or D17

Figure 7D:
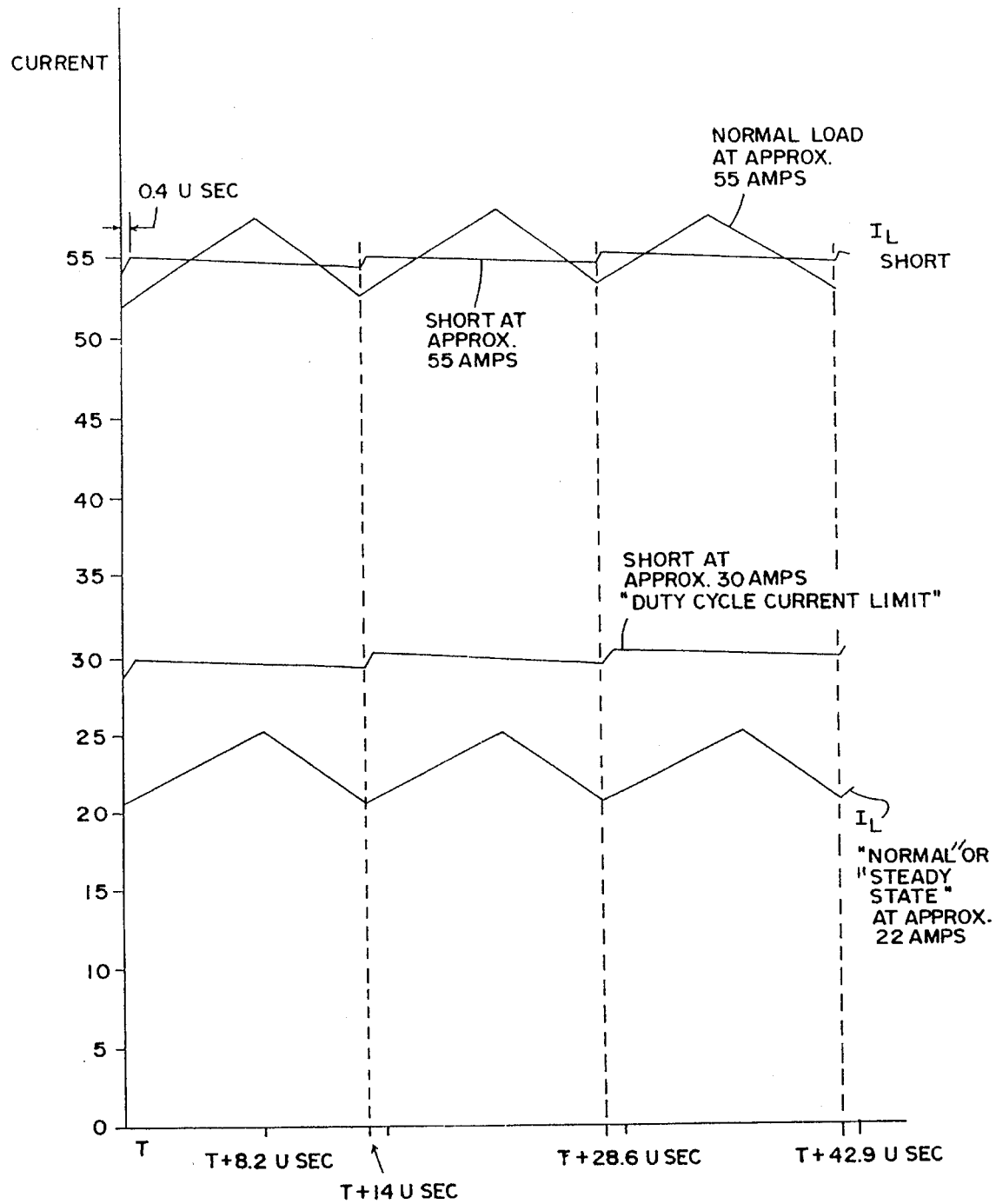
FIG. 7D is a timing diagram illustrating inductor signals associated with a shorted output and normal operation of the power converter.

$V_{out} \approx 13.5$ volt=output voltage $V_{BATT}$=input battery voltage in FIG. 6=24 volts
(Note: In FIG. 8 a typical C2 voltage of 156 volts reflected to the secondary of T1, a13:2 transformer, is equivalent to the 24 volts above). These different charging and discharging characteristics of the inductor are illustrated in FIG. 7D. Thus, the control pulses output at pins 11 and 14 of U1 will have a very short duty cycle in a short circuit condition. In normal operation, in a steady state, the current feedback at pin 4 will take longer to reach the voltage controlled current limit present at pin 7 because the current through resistor R7 will not rise as rapidly to the current limit. When operating at full load, the current limit is even higher than what it is in short circuits. Thus, the "ON" period of the duty cycle will be longer during normal operation than during a short duty cycle condition.

A reverse battery condition is similar to a short circuit condition in that the output voltage at terminal 32 is at ground. Thus, the MOSFETs will be shut off after a very short portion of each duty cycle. The duty cycle controlled current limit established by capacitor C4 and diode D3 effectively lowers the absolute current limit control in a reverse battery condition, such that the MOSFETs Q1 and Q2 turn off very quickly. Additionally, in a reverse battery condition, the current output will rise to a level greater than that which fuses F1 and F2 can pass, which causes both of these fuses to open.

A thermal shutdown circuit 170 is connected to pin 16 of integrated circuit U1. The thermal shutdown circuit includes a thermistor RT1 and a resistor R17 connected in series between 15 volt output 108 and signal ground, and a capacitor C13 connected in parallel with resistor R17. Thermistor RT1 is an NTC thermistor mounted on housing 18. The cooling fin is thermally coupled to the MOSFETs Q1 and Q2, as well as the other circuit components requiring cooling. As the temperature of thermistor RT1 rises, the voltage across resistor RT1 lowers, which raises the voltage of pin 16. If the voltage across pin 16 of integrated circuit U1 exceeds approximately 0.35 volts (a reference voltage set internally of the integrated circuit), U1 shuts down. When U1 shuts down, no pulses are output to switches Q1 and Q2. In this state, the only power dissipated by converter 20 is the power dissipated by resistor R1. This thermal switch shuts the circuit down before the power converter becomes a fire hazard.

Output pin 14 of integrated circuit U1 is connected to the junction of diodes D12 and D13. Diodes D12 and D13 are Schottky diodes connected to 15 volts and ground, respectively, and prevent the U1 from going one diode drop above or one diode drop below the power of U1. A gate resistor R3 is connected to pin 14 and to the gate of MOSFET Q2. A Zener diode D14 is connected between the gate and source of MOSFET Q2 to protect the MOSFET element from a gate voltage exceeding the reverse breakdown voltage of this Zener diode. Output pin 11 is similarly connected to the junction of diodes D5, D6 and Zener diode D4. The MOSFET elements Q1 and Q2 are also protected by series connected diodes D8, D9 and D10, D11, respectively. These Zener diodes protect the MOSFET switches against transient voltages exceeding approximately 400 volts. Although diodes D8–D11 are provided in the preferred embodiment, it is envisioned that these diodes could be omitted.

The sources of MOSFETs Q1 and Q2 are connected through a resistor R6 to ground. Accordingly, when either one of MOSFETs Q1 and Q2 is conducting, the current path from transformer winding 122 is through the conducting one of MOSFETs Q1 and Q2 and resistor R6. Diodes D15 and D19, connected in series, are connected in parallel with resistor R6. The diodes D15 and D16 limit the voltage across resistor R6 to approximately 1.4 volts (the sum of the forward voltage drop of diodes D15 and D19). Capacitor C20, connected in parallel with resister R6, filters the signal on resistor R6 to remove noise.

The switching control circuit 92 generates pulse signals applied to MOSFETs Q1 and Q2 such that MOSFETs Q1 and Q2 do not conduct at the same time. Additionally, the MOSFETs are controlled such that their respective duty cycles are dependent upon the magnitude of the output signal at junction 130 and the absolute current limit. The larger the output signal at junction 130, the longer the duty cycle of the MOSFETS Q1 and Q2.

Figure 9:
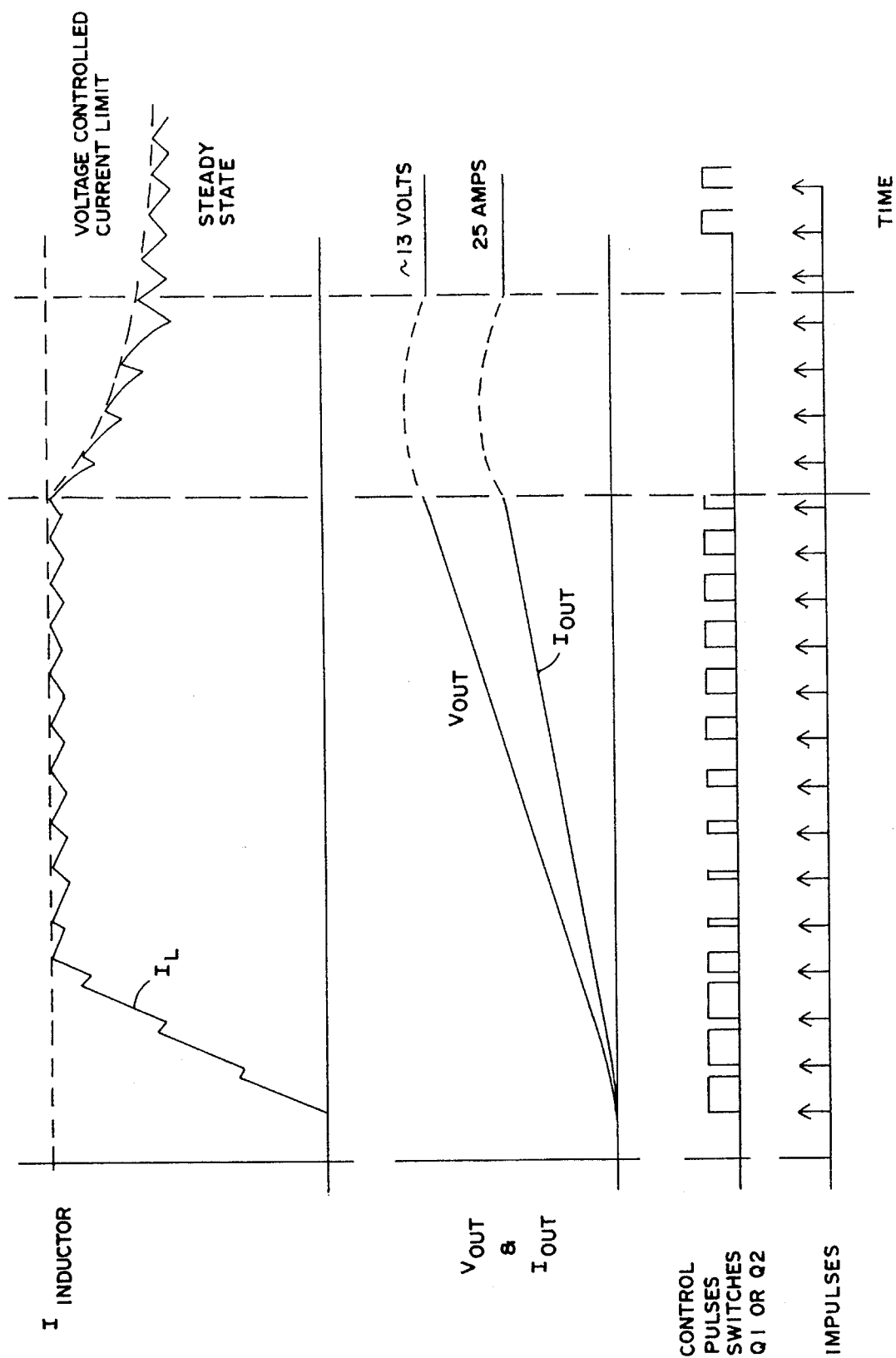
FIG. 9 is a timing diagram illustrating signals associated with the switched power converter according to FIG. 8.

More particularly, and with reference to FIG. 9, at turn on the current through inductor L1 will rise to the limit set by the absolute current limit and limited by an intrinsic duty cycle limit. The absolute current limit (55 amperes) is reached in approximately 40.5 usec for a 20 uhenry inductor L1. This corresponds to three and one-half cycles for oscillator 70 having a frequency of 70,000 Hz and a maximum 75% duty cycle. The output current at the terminal will rise gradually with the output voltage. In the preferred embodiment, it takes a minimum of 544 usec to charge the output 2200 ufarad capacitor to 13.6 volts. This takes approximately fifty cycles at a 75% duty cycle and without a load. This charging time is extended when a load is connected to output 32. When the output voltage reaches approximately 13 volts, the voltage control current limit reduces the amount of time that the inductor L1 charges. This lowers the inductor current. Over a transition period, the output voltage and output current will settle to a regulated, steady-state level of approximately 13 volts and with that current necessary for 13 volts, in this case shown as 25 amperes.

In a reverse battery condition, the voltage at output 32 will be zero or less, and circuit 20 will initially inject increasing current. The current in resistor R7 will rise within a few cycles to the absolute current limit and the MOSFET switches Q1 and Q2 are turned off immediately. The fuses F1 and F2 are provided to interrupt the large current that is injected into the circuit in this condition. The fuses are together transient rated at approximately 2500 amp$^2$-sec. Consequently, these fuses F1 and F2 will open, or form a voltage absorbing spark gap, in the order of:

10 msec. at 500 amps 2.5 msec. at 1,000 amps 0.4 msec. at 2,500 amps.

If the current injected into the fuses is approximately 1,000 amps, the output capacitors will discharge in the initial 0.03 msec., and the fuses will not interrupt the current for 2.5 msec. This large amplitude current cannot flow immediately through diodes D16 and DI7 since inductor L1 has an inductance of 20 uhenry. The voltage across L1 equals ($V_{D7}-V_{D16}$) plus the transformer coil drop. If $V_{L1}$ is approximately 0.5 volts, then the current increases 12.5 amps in 0.5 msec., and in 2.5 msec. the current increases 62.5 amps. The total current of inductor L1 will be limited to approximately 110 amps in 2.5 msec. Therefore, most of the injected current flows through diode D7, which is connected in parallel to capacitor C6, and is forward biased in a reverse battery condition. Thus, diode D7 is necessary to protect capacitor C6 before the fuses open, by shorting the output voltage across capacitor C6, and draws current away from other components of the circuit, when a reverse battery condition is made. Without D7 all current would flow through D16, D17 and therefore the reflected current in Q1, Q2 would fail the converter.

A current of 110 amps in the inductor L1 is reflected to the primary as 16.92 amps. Although the fuses F1 and F2 will eventually interrupt the current, as noted above, they operate too slowly to protect the MOSFET devices Q1 and Q2 from this current. The duty cycle controlled current limit will become active at about 0.4 msec. This duty cycle current limit and the absolute current limit help protect the MOSFET devices by turning these switches off quickly.

Figure 3A:
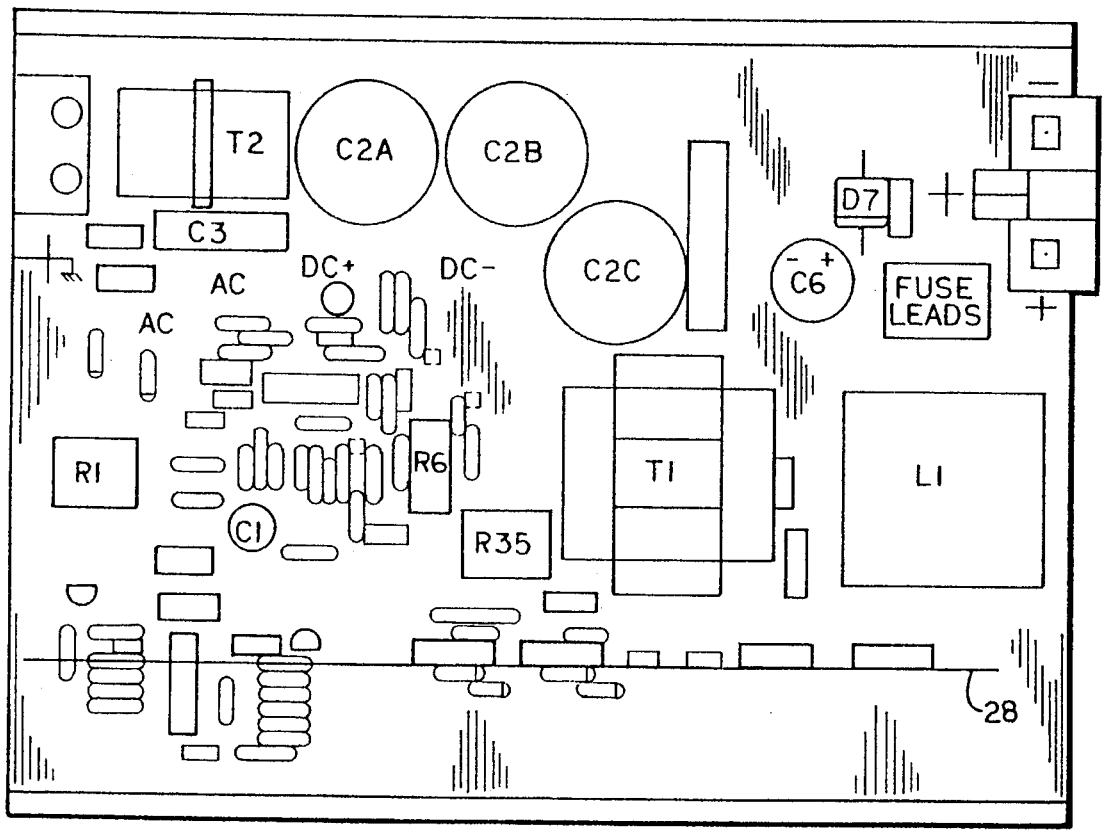
FIG. 3a is a top schematic view of the power converter circuit showing the relative horizontal spacing of the circuit components according to FIG. 3.

Additional protection is provided by a fan 54, under control of control circuit 98. The fan control circuit 98 includes a NTC thermistor RT2 connected in series with a resistor R18 between the output junction 130 and output ground 34. As illustrated in FIG. 3a, the transistor Q2, Q1, the thermistors RT1, RT2, and diodes D16, D17 are positioned on the inside surface of wall 28. Diode D17 is held against the inside surface of wall 28 by a resilient clip 181 secured to wall 28 by screw 183. Clip 181 is preferably a metallic component including a J-shaped finger 185 extending from a flat shoulder 187. The clip 181 is anchored in a recess 188 by an integral toe 189. Finger 185 exerts pressure on diode D17 to securely hold the diode abutting wall 28. The wall 28, which is a heat sink, is at substantially the same temperature at all six locations where Q1, Q2, RT1, RT2, D16 and D17 are mounted, such that the temperature of the thermistor is dependent upon the temperature of components Q1, Q2, D16, D17. The fins help cool wall 28 and the components held on wall 28.

The junction 190 of thermistor RT2 and resistor R18 is connected to the non-inverting input of an amplifier 194. The inverting input of amplifier 194 is connected to the junction 192 of a resistor R19 and a resistor R20, which are connected in series between junction 130 and output ground. Amplifier 194 also has a feedback resistance R31 connected between the output and the non-inverting input of amplifier 194. The output of amplifier 194 is connected to the base of a transistor Q3 through a resistor R21. Transistor Q3 is connected between the fan 54 and output ground such that the fan receives an energizing current when transistor Q3 conducts. The NTC thermistor RT2 drops when the temperature of the heat sink to which it is connected rises such that the potential at the junction 190 rises above predetermined threshold level set by the impedance of resistors R19 and R20. Resistor R27 with C24 filters the IC power terminal, pin 4. Its impedance and voltage drop are negligible. Pin 6 is fixed at half output voltage. R31 provides historesis. The unit starts with fan off, pin 7 low. As the temperature rises, RT2 decreases and pin 5 voltage increases. When the pin 5 voltage equals the pin 6 voltage, pin 7 goes high, injecting current into node 190 and further increases pin 5 voltage. Thus, RT2 must increase significantly, i.e., the temperature must decrease significantly before pin 5 gets back down to pin 6 voltage. When pin 7 switches back low, R31 then sinks current away from node 190 pulling the voltage even lower. The positive feedback provides historesis such that the fan turns off at a temperature below the temperature at which the fan is turned on.

When the voltage at junction 190 is greater than the voltage at junction 192 (which corresponds to approximately 52° C.) output of amplifier 194 goes high. This causes Q3 to conduct current which energizes fan 54. As mentioned above, the circuit inchides a historesis effect wherein the voltage at junction 190 required to turn the fan off corresponds to a temperature of approximately 38° C. This insures that once the fan is on, it will remain on until the circuit cools significantly to eliminate rapid switching between on and off states. Through experimentation, it was found that roughly 20% of full load current can be delivered without turning the fan on, such that at night when people are sleeping, the fan noise will not disturb the sleepers.

The fan control circuit 98 and the thermal shutdown circuit 170 each include a respective NTC thermistor RT1 and RT2, having a temperature dependent impedance. These thermistors are preferably 15% tolerance devices 5% per degree Celsius change. These thermistors are positioned on the common heat sink, and may, for example be spaced by approximately one-quarter of an inch. The heat dissipation member is preferably connected to all the semiconductor devices in circuit 20 such that all these devices can turn on the fan 54 and effect turn-off of integrated circuit U1.

Thus, it can be seen that a switched power converter is disclosed which effectively provides a stable, substantially ripple-free regulated output voltage. The circuit includes a thermal shutdown circuit 170 which limits the circuit operation if the power converter is mounted in the recreational vehicle 11 such that heat cannot be adequately dissipated while permitting the switched power converter to continue operating. The switched power converter dissipates about 6 Wattsh in shutdown mode. The circuit provides protection against reverse battery connections or a short circuit condition. Additional protection is provided by a novel current feedback arrangement having a lower absolute current limit during a short duty cycle condition. The circuit also provides improved thermal protection. A fan is controlled such that it operates only when the temperature exceeds a threshold level. Additional thermal protection is provided by shutting down the switched power converter when a threshold temperature is exceeded. The switched power converter is thus intelligent enough to identify dangerous temperature conditions and restricts operation of the power supply to protect the circuit components. The operating life of the switched power converter in the environment of a recreational vehicle is thereby significantly enhanced by the immediate invention.

The above description is that of the preferred embodiment of the invention. Various changes and alterations can be made without departing from the spirit and scope of the invention as set forth in the appended claims. Accordingly, all such modifications are to be considered as being within the scope of the claims.

The embodiments of the invention in which an exclusive property or privilege is claimed are defined as follows:

1. A switched power converter for a recreational vehicle, said switched power converter producing a stable DC output voltage for the electrical system of the recreational vehicle from an AC power supply, the power converter comprising:

a housing;

a switched power supply positioned in said housing, said switched power supply including a switch and at least one energy storage component for converting the AC supply voltage to a regulated DC voltage at an output thereof;

a sensor positioned in said housing for generating a temperature dependent signal;

a fan positioned on said housing to move cooling air over said switched power supply;

a control circuit coupled to said sensor and to said fan, said control circuit including a first temperature detector and a controlled power supply selectively supplying power to said fan, whereby said fan is enabled by said selective power supply when said first temperature detector detects that a temperature is above a first threshold level and said fan is disabled by said selective power supply when said first temperature detector detects that the temperature is below a second threshold level; and a second temperature detector coupled to said switched power supply, said second temperature detector inputting a temperature dependent signal to said switched power supply.

2. The power converter as defined in claim 1, wherein said switched power supply includes a circuit for disabling an output of said switched power supply when said second temperature detector outputs a signal exceeding a predetermined threshold.

3. The power converter as defined in claim 2, wherein said switched power supply includes a plurality of semiconductor devices, and said housing includes a wall, at least selected ones of said semiconductor devices carried on said wall.

4. The power converter as defined in claim 3, wherein said first temperature detector and said second temperature detector are positioned against said wall.

5. A switched power converter for a recreational vehicle, said switched power converter producing a stable DC output voltage for the electrical system of the recreational vehicle from an AC power supply, the power converter comprising:

a housing;

a switched power supply positioned in said housing, said switched power supply including a switch and at least one energy storage component for converting the AC supply voltage to a regulated DC voltage at an output thereof;

a sensor positioned in said housing for generating a temperature dependent signal;

a fan positioned on said housing to move cooling air over said switched power supply;

a control circuit coupled to said sensor and to said fan, said control circuit including a first temperature detector and a controlled power supply selectively supplying power to said fan, whereby said fan is enabled by said selective power supply when said first temperature detector detects that a temperature is above a first threshold level and said fan is disabled by said selective power supply when said first temperature detector detects that the temperature is below a second threshold level;

a current sensor for detecting a current level associated with said energy storage element; and a voltage feedback circuit coupled to said output of said switched power supply and generating a voltage feedback signal having a level related to the voltage at said switched power supply output, and wherein said sensed current level is compared to an output of said voltage feedback signal.

6. The power converter circuit as defined in claim 5, wherein said switch of said switched power supply is switched off when said sensed current level exceeds said voltage feedback signal.

7. The power converter as defined in claim 6, further including a circuit for establishing an absolute current limit for said voltage feedback circuit output signal.

8. The power converter as defined in claim 7, further including a selector for selecting one of at least two different absolute current limits.

9. The power converter as defined in claim 8, wherein said selector selects a first absolute current limit when an output voltage of said switched power supply is below an output threshold level and a lower absolute current limit when said power supply output is above said output threshold level.

10. A switched power converter for a recreational vehicle, said switched power converter producing a stable DC output voltage for the electrical system of the recreational vehicle from an AC power supply, the power converter comprising:

a housing;

a switched power supply positioned in said housing, said switched power supply including a switch and at least one energy storage component for converting the AC supply voltage to a regulated DC voltage at an output thereof;

a sensor positioned in said housing for generating a temperature dependent signal;

a fan positioned on said housing to move cooling air over said switched power supply; and a control circuit coupled to said sensor and to said fan, said control circuit including a first temperature detector and a controlled power supply selectively supplying power to said fan, whereby said fan is enabled by said selective power supply when said first temperature detector detects that a temperature is above a first threshold level and said fan is disabled by said selective power supply when said first temperature detector detects that the temperature is below a second threshold level;

wherein said switched power supply includes a feedback circuit and a controller, said feedback circuit coupled between an output of said switched power supply and said controller and said controller generating controls signals applied to said switch;

wherein said feedback circuit includes an optical coupler providing isolation between said controller and said output of said switched power supply; and wherein said feedback circuit further includes a compensation circuit coupled to said optical coupler, said compensation circuit compensating for variations in the operating characteristics of said optical coupler.

11. A switched power converter for a recreational vehicle, said switched power converter producing a stable DC output voltage at a power converter output for connection to a battery, the power converter comprising:

a switched power supply including a switch and at least one energy storage component producing a regulated, stable DC voltage;

a controller generating a switching control signal for controlling said switch to selectively supply energy to said at least one energy storage component;

protection circuitry protecting said power supply from damage resulting when a reverse battery connection is made between the power converter output and the battery;

a current sensor for detecting a current level associated with said energy storage elements; and a voltage feedback circuit coupled to an output of said switched power supply and producing a voltage feedback signal having a level related to the voltage at said switched power supply output, and wherein said current level is compared to said voltage feedback signal.

12. The power converter circuit as defined in claim 11, wherein said switch of said switched power supply is switched off when said sensed current level signal exceeds said voltage feedback signal.

13. The power converter as defined in claim 12, further including a circuit for limiting said voltage feedback signal to at least one absolute limit.

14. The power converter as defined in claim 13, wherein said limiting circuit sets said absolute limit to at least two levels.

15. The power converter as defined in claim 13, wherein said limiting circuit sets said absolute limit a first fixed absolute limit level when an output voltage of said switched power converter is below an output threshold level and said limiting circuit sets said absolute limit to a second, lower absolute limit when said power supply output is above said output threshold level.

16. The power converter as defined in claim 11, wherein said voltage feedback signal is coupled to said controller through an optical coupler providing isolation between said controller and said power supply output.

17. The power converter as defined in claim 16, further including a compensation circuit coupled to said optical coupler, said compensation circuit compensating for variations in the operating characteristics of said optical coupler.

18. A switched power converter for a recreational vehicle, said switched power converter producing a stable DC voltage at an output thereof, the power converter comprising:

a switched power supply circuit including a switch and at least one storage element;

a controller coupled to said switch for controlling the on-time of said switch;

a circuit coupled to said controller for limiting the output of said switched power supply by selectively limiting the on-time of said switch in said switched power supply;

a current sensor for detecting a current level associated with said at least one energy storage element; and a voltage feedback circuit coupled to an output of said switched power supply, said controller comparing said sensed current level to a voltage feedback signal output by said voltage feedback circuit said voltage feedback signal having a level related to the voltage at said output of said switched power supply.

19. The power converter circuit as defined in claim 18, wherein said switch is turned off when said sensed current level exceeds said voltage feedback signal.

20. The power converter as defined in claim 19, further including a limiter for limiting said voltage feedback signal to an absolute voltage limit.

21. The power converter as defined in claim 20, wherein said limiter limits said voltage feedback signal to one of at least two absolute limit levels.

22. The power converter as defined in claim 21, wherein a first absolute current limit is selected when an output voltage of said power supply is below an output threshold level and a lower absolute current level is selected when said output of said power supply is above said output threshold level.

23. A switched power converter for a recreational vehicle, said switched power converter producing a stable DC output voltage at a power converter output for connection to a battery, the power converter comprising:

a switched power supply including a switch and at least one energy storage element;

a current sensor for detecting a current level associated with said energy storage element; and a voltage feedback circuit coupled to an output of said switched power supply and generating a voltage feedback signal having a level related to the voltage at said switched power supply output, and wherein said sensed current level is compared to the level of said voltage feedback signal.

24. The switched power converter as defined in claim 23, and further including a controller coupled to said switch for controlling the on-time of said switch based upon the comparison of said sensed current level with the level of said voltage feedback signal, which functions as a variable voltage controlled current limit.

25. The switched power converter as defined in claim 24, wherein said controller limits the on-time of said switch when said voltage feedback signal indicates that a reverse battery connection is made between the power converter output and the battery to protect said switched power supply from damage.

26. A switched power converter for a recreational vehicle, said switched power converter producing a stable DC output voltage for the electrical system of the recreational vehicle from an AC power supply, the power converter comprising:

a switched power supply including a switch and at least one energy storage component for converting the AC supply voltage to a regulated DC voltage at an output thereof;

wherein said switched power supply includes a feedback circuit and a controller, said feedback circuit coupled between an output of said switched power supply and said controller and said controller generating control signals applied to said switch;

wherein said feedback circuit includes an optical coupler providing isolation between said controller and said output of said switched power supply; and wherein said feedback circuit further includes a compensation circuit coupled to said optical coupler, said compensation circuit compensating for variations in the operating characteristics of said optical coupler.

27. A switched power converter for a recreational vechile, said switched power converter producing a stable DC output voltage at a power converter output for connection to a battery, the power converter comprising:

a switched power supply including a switch and at least one energy storage component producing a regulated, stable DC voltage;

a controller generating a switching control signal for controlling said switch to selectively supply energy to said at least one energy storage component; and protection means for sensing when a reverse battery connection is made between the power converter output and the battery and for causing said controller to control said switch to limit the energy supplied to said at least one energy storage component and to protect said switched power supply from damage resulting from a reverse battery connection.

28. The switched power converter as defined in claim 27, wherein said protection means includes:

a current sensor for detecting a current level associated with said energy storage elements;

a voltage feedback circuit coupled to an output of said switched power supply and producing a voltage feedback signal having a level related to the voltage of said output; and a comparator coupled to said controller for comparing said current level to said voltage feedback signal and for signalling said controller when said voltage feedback signal indicates that a reverse battery connection is made between the power converter output and the battery.

29. The switched power converter as defined in claim 28, wherein said protection means further includes a diode connected to said comparator for limiting the level of said voltage feedback signal supplied to said comparator to a voltage level representing an absolute current limit for comparison with said sensed current level.

30. The switched power converter as defined in claim 27, wherein said protection means further includes a fuse connected between the power converter output and the battery.

31. The switched power converter as defined in claim 27, wherein said energy storage component includes a capacitor, and said protection means includes a capacitor switch connected across said capacitor.

32. The switched power converter as defined in claim 31, wherein said capacitor switch includes a diode which is forward biased when said power converter output is connected to a battery in reverse.

33. A power converter for a recreational vehicle, said power converter producing a stable DC output voltage at a power converter output for connection to a battery, the power converter comprising:

a power supply including at least one energy storage component producing a regulated, stable DC voltage;

a controller for selectively supplying energy to said at least one energy storage component; and a reverse battery connection protection circuit including:
  a diode coupled across the output terminals of the power converter, which are adapted for connection to the terminals of the battery, said diode being forward-biased when said power converter output is connected to a battery in reverse and reverse-biased at all other times, and
  a fuse coupled between the power converter output and the battery for protecting the power converter against large currents which occur if the battery is connected to the power converter output in reverse, wherein said fuse interrupts the connection between the power converter and the battery only when said diode is forward-biased as a result of a reverse battery connection.

34. The power converter as defined in claim 33 and further including a second fuse coupled between the power converter output and the battery in parallel with the first fuse.

35. The power converter as defined in claim 33, wherein said energy storage component includes a capacitor, and said diode is connected across said capacitor.

36. The power converter as defined in claim 33 and further including:

a current sensor for detecting a current level associated with said energy storage component; and a voltage feedback circuit coupled to the power converter output and producing a voltage feedback signal having a level related to the voltage of said output, said voltage feedback signal serving as a voltage controlled current limit, wherein said power supply further includes a switch controlled by said controller to selectively supply power to said energy storage component, and wherein said controller includes a comparator coupled to said current sensor and to said voltage feedback circuit for comparing said current level to said voltage feedback signal, said controller controls the on-time of said switch based upon the comparison of said sensed current level with the voltage controlled current limit established by the level of said voltage feedback signal.

37. The power converter as defined in claim 36, wherein said controller further includes absolute current limiting means coupled to said comparator for establishing an absolute current limit that said controller will not allow said sensed current to exceed.

38. The power converter as defined in claim 37, wherein said absolute current limiting means includes a Zener diode.

39. A power converter for a recreational vehicle, said power converter producing a stable DC output voltage at a power converter output for connection to a battery, the power converter comprising:

a power supply including at least one energy storage component producing a regulated, stable DC voltage;

a controller for selectively supplying energy to said at least one energy storage component; and a reverse battery connection protection circuit including:
  a switch coupled across the output terminals of the power converter, which are adapted for connection to the terminals of the battery, said switch being conductive when said power converter output is connected to a battery in reverse and nonconductive at all other times, and
  a current interrupting element coupled between the power converter output and the battery for protecting the power converter against large currents which occur if the battery is connected to the power converter output in reverse, wherein said current interrupting element interrupts the connection between the power converter and the battery only when said switch is conducting as a result of a reverse battery connection.

40. The power converter as defined in claim 33, wherein said switch is a diode.

\* \* \* \* \*

UNITED STATES PATENT AND TRADEMARK OFFICE
CERTIFICATE OF CORRECTION

PATENT NO. : 5,600,550
DATED : February 4, 1997
INVENTOR(S) : James C. Cook, II

It is certified that error appears in the above-identified patent and that said Letters Patent is hereby corrected as shown below:

Column 18,
Line 22, "lower" should be -- higher --

Column 20,
Line 4, "lower" should be -- higher --

Signed and Sealed this

Eighteenth Day of May, 2004

JON W. DUDAS
*Acting Director of the United States Patent and Trademark Office*